United States Patent
Wu et al.

(10) Patent No.: US 9,318,700 B2
(45) Date of Patent: Apr. 19, 2016

(54) METHOD OF MANUFACTURING A PHASE CHANGE MEMORY DEVICE

(71) Applicant: SAMSUNG ELECTRONICS CO., LTD., Suwon-si, Gyeonggi-do (KR)

(72) Inventors: Zhe Wu, Suwon-si (KR); Jeong-Hee Park, Hwaseong-si (KR); Dong-Ho Ahn, Hwaseong-si (KR); Jung-Hwan Park, Seoul (KR); Jun-Ku Ahn, Hwaseong-si (KR); Sung-Lae Cho, Gwacheon-si (KR); Hideki Horii, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/740,929

(22) Filed: Jun. 16, 2015

(65) Prior Publication Data
US 2015/0364678 A1    Dec. 17, 2015

(30) Foreign Application Priority Data
Jun. 16, 2014   (KR) .......................... 10-2014-0073013

(51) Int. Cl.
*H01L 21/20*   (2006.01)
*H01L 45/00*   (2006.01)

(52) U.S. Cl.
CPC ............ *H01L 45/06* (2013.01); *H01L 45/1233* (2013.01); *H01L 45/1253* (2013.01); *H01L 45/141* (2013.01); *H01L 45/1616* (2013.01); *H01L 45/1625* (2013.01); *H01L 45/1641* (2013.01); *H01L 45/1666* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 7,381,611 B2 | 6/2008 | Johnson et al. | |
| 7,417,245 B2 | 8/2008 | Happ et al. | |
| 7,663,137 B2 | 2/2010 | Campbell | |
| 7,759,667 B2 | 7/2010 | Park et al. | |
| 7,884,347 B2 | 2/2011 | Yoon et al. | |
| 7,973,384 B2 | 7/2011 | Happ et al. | |
| 8,227,785 B2 | 7/2012 | Erbetta | |
| 8,493,772 B2 | 7/2013 | Liu | |
| 8,557,627 B2 | 10/2013 | Oh et al. | |
| 2008/0191188 A1* | 8/2008 | Jeong ..................... G11C 11/56 257/4 | |
| 2009/0078924 A1* | 3/2009 | Liang ..................... H01L 45/06 257/3 | |
| 2010/0283029 A1 | 11/2010 | Dennison et al. | |

(Continued)

FOREIGN PATENT DOCUMENTS

| KR | 2006-0089401 A | 8/2006 |
|---|---|---|
| KR | 20110001840 A | 1/2011 |

(Continued)

*Primary Examiner* — Angel Roman
(74) *Attorney, Agent, or Firm* — Volentine & Whitt, PLLC

(57) ABSTRACT

In a method of manufacturing a phase change memory device, an insulating interlayer having a through opening is formed on a substrate, at least one conformal phase change material layer pattern is formed along the sides of the opening, and a plug-like phase change material pattern having a composition different from that of each conformal phase change material layer pattern is formed on the at least one conformal phase change material layer pattern as occupying a remaining portion of the opening. Energy is applied to the phase change material layer patterns to form a mixed phase change material layer pattern including elements from the conformal and plug-like phase change material layer patterns.

20 Claims, 23 Drawing Sheets

(56) References Cited

U.S. PATENT DOCUMENTS

| | | |
|---|---|---|
| 2010/0327251 A1 | 12/2010 | Park |
| 2011/0248235 A1 | 10/2011 | Jeong et al. |
| 2011/0297911 A1* | 12/2011 | Shima ................ H01L 27/2409 257/4 |
| 2011/0317480 A1 | 12/2011 | Lung et al. |
| 2012/0276819 A1 | 11/2012 | Lee et al. |
| 2013/0221310 A1* | 8/2013 | Morikawa ............ H01L 45/144 257/2 |
| 2013/0299766 A1 | 11/2013 | Park et al. |
| 2015/0041747 A1* | 2/2015 | Kim ...................... H01L 45/144 257/2 |

FOREIGN PATENT DOCUMENTS

| | | |
|---|---|---|
| KR | 2011-0113054 A | 10/2011 |
| KR | 2013-0095432 A | 8/2013 |
| KR | 1334789 B | 11/2013 |

* cited by examiner

2ND
DIRECTION
⊗ → 1ST
DIRECTION

1ST
DIRECTION
⊗ → 2ND
DIRECTION

METHOD OF MANUFACTURING A PHASE CHANGE MEMORY DEVICE

PRIORITY STATEMENT

This application claims priority under 35 USC §119 to Korean Patent Application No. 10-2014-0073013, filed on Jun. 16, 2014 in the Korean Intellectual Property Office (KIPO), the contents of which are hereby incorporated by reference in their entirety.

BACKGROUND

1. Field

Embodiments according to the inventive concept relate to a method of manufacturing a phase change memory device.

2. Description of the Related Art

Data may be stored in a memory device by using a phase change material layer pattern whose resistance varies depending on whether the phase change material of the layer pattern is in an amorphous state or crystalline state. Examples of such phase change material are chalcogen compounds, e.g., germanium-antimony-tellurium (GST). In the case of chalcogen compounds, the electrical characteristics of the memory device may depend on the composition of the chalcogen compound. In addition, a desired composition of a chalcogen compound, e.g., the ratio of its elements, may be produced by appropriately controlling its deposition conditions, e.g., temperature, pressure, deposition rate, etc. However, it can be difficult to deposit a chalcogen compound having a specific composition in an opening having a high aspect ratio. For example, when depositing phase change material in an opening having a high aspect ratio, and subsequently planarizing the resulting layer of material to produce a phase change material layer pattern, the phase change material layer pattern may have a void therein or form an overhang, or nodes of the phase change material layer may not be split by the planarization process.

SUMMARY

According to an aspect the inventive concept, there is provided a method of manufacturing a phase change memory device, which includes forming an insulating interlayer on a substrate, the insulating interlayer having an opening therethrough, forming a first phase change material layer pattern along a surface defining sides of the opening, forming a second phase change material layer pattern on the first phase change material layer pattern in a portion of the opening and such that the second phase change material layer pattern has a composition different from that of the first phase change material layer pattern, and applying energy to the first and second phase change material layer patterns to form a third phase change material layer pattern. The third phase change material pattern is thus formed to have a composition different from that of each of the first and second phase change material layer patterns and include elements from both of the first and second phase change material layer patterns.

According to another aspect of the inventive concept, there is provided a method of manufacturing a phase change memory device, which includes forming an insulating interlayer on a substrate, the insulating interlayer having an opening therethrough, forming a plurality of phase change material layers each on a surface defining sides of the opening and atop the insulating interlayer and such that the plurality of phase change material layers have different compositions from each other, planarizing the phase change material layers until a top surface of the insulating interlayer is exposed to form a plurality of preliminary phase change material layer patterns in the opening, and applying energy to the plurality of preliminary phase change material layer patterns to form a phase change material layer pattern having a composition different from each of those of the preliminary phase change material layer patterns and such that the phase change material layer pattern includes elements from the plurality of preliminary phase change material layer patterns.

According to still another aspect of the inventive concept, there is provided a method of manufacturing a phase change memory device, which includes forming an insulating interlayer, having spaced apart openings passing therethrough, on a substrate, forming at least one conformal layer comprising phase change material on the insulating interlayer such that each conformal layer extends within the openings and the conformal layer(s) leaves a portion of each of the openings unfilled, forming a blanket layer comprising phase change material directly on the conformal layer(s) to fill what remains of the openings and such that the phase change material of the blanket layer has a composition different from that of the phase change material of each conformal layer, planarizing the layers comprising phase change material until a top surface of the interlayer insulating layer is exposed, thereby forming a plurality of patterns of phase change material in each of the openings, and applying energy to the phase change material layer patterns to form, within each of the openings, a pattern of phase change material having a composition different from that of the phase change material of each of the layers of phase change material and including a mixture of elements of phase change material from the layers of phase change material.

BRIEF DESCRIPTION OF THE DRAWINGS

Embodiments according to the inventive concept will be more clearly understood from the following detailed description taken in conjunction with the accompanying drawings.

FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31 and 32 are cross-sectional views, respectively, of a phase change memory device during the course of its manufacture and together illustrate one embodiment of a method of manufacturing a phase change memory device in accordance with the inventive concept;

FIG. 33 is a perspective view of an example of a phase change memory device made by the method of FIGS. 1-32;

FIGS. 34, 35, 36, 37, 38, 39, 40, 41, 42 and 43 are cross-sectional views, respectively, of a phase change memory device during the course of its manufacture and together illustrate another embodiment of a method of manufacturing a phase change memory device in accordance with the inventive concept; and FIG. 44 is a perspective view of an example of a phase change memory device made by the method of FIGS. 34-43.

DETAILED DESCRIPTION OF THE PREFERRED EMBODIMENTS

Figure 1:
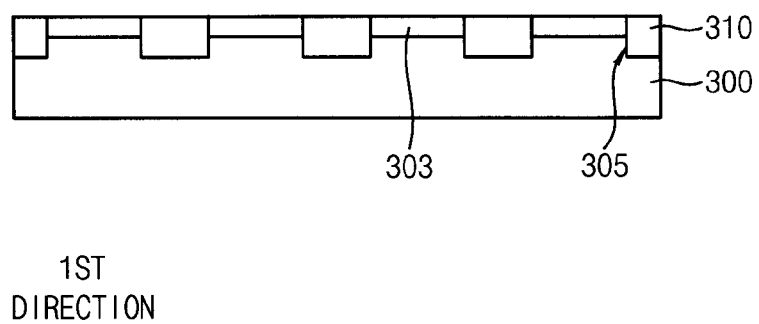
FIGS. 1 to 44 represent non-limiting, embodiments according to the inventive concept as described herein.

Various embodiments according to the inventive concept will be described more fully hereinafter with reference to the accompanying drawings, in which some embodiments according to the inventive concept are shown. The present inventive concept may, however, be embodied in many different forms and should not be construed as limited to the embodiments according to the inventive concept set forth herein. Rather, these embodiments according to the inventive concept are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments according to the inventive concept only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. The term "extending," as the drawings and context make clear will generally refer to the longitudinal direction or longest dimension of a feature or element, especially in the case of a line-shaped feature or element. The term "formed of" may be used synonymously with "consisting of" but not exclusively; that is, the term "formed of" may also mean formed to include. Furthermore, the term "composition" may refer to both elements and/or their concentration in a particular composition. "Concentration" will be understood to refer to wt %.

Embodiments according to the inventive concept are described herein with reference to cross-sectional illustrations that are schematic illustrations of idealized embodiments according to the inventive concept (and intermediate structures). As such, variations from the shapes of the illustrations as a result, for example, of manufacturing techniques and/or tolerances, are to be expected. Thus, embodiments according to the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 32:
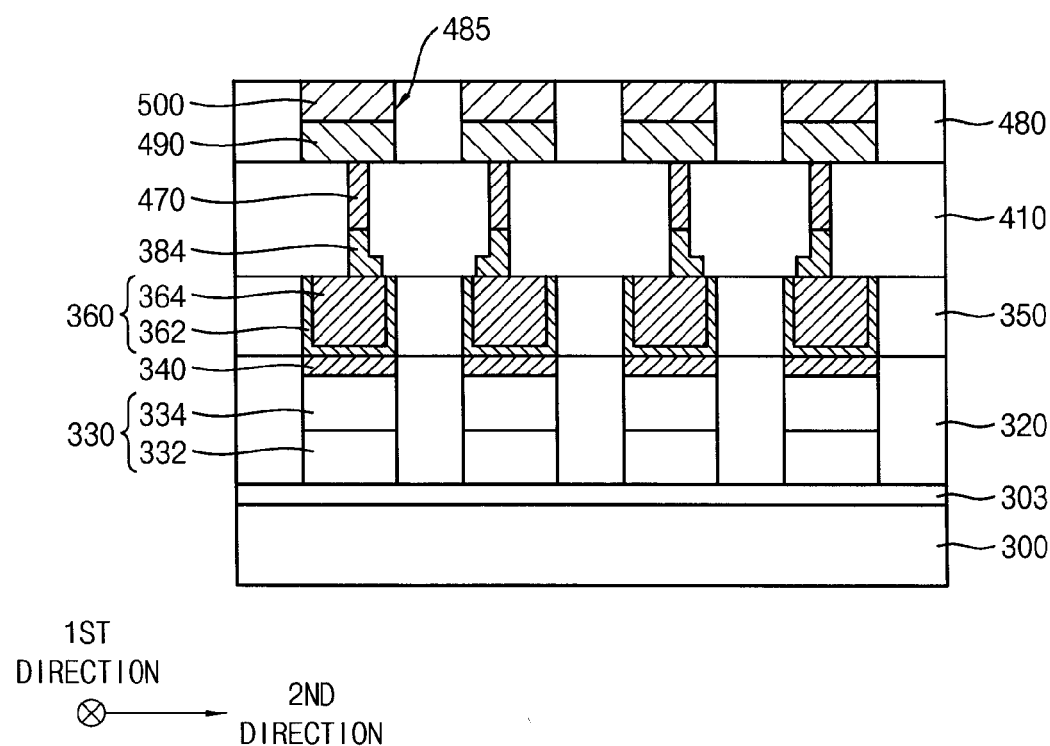
Figure 33:
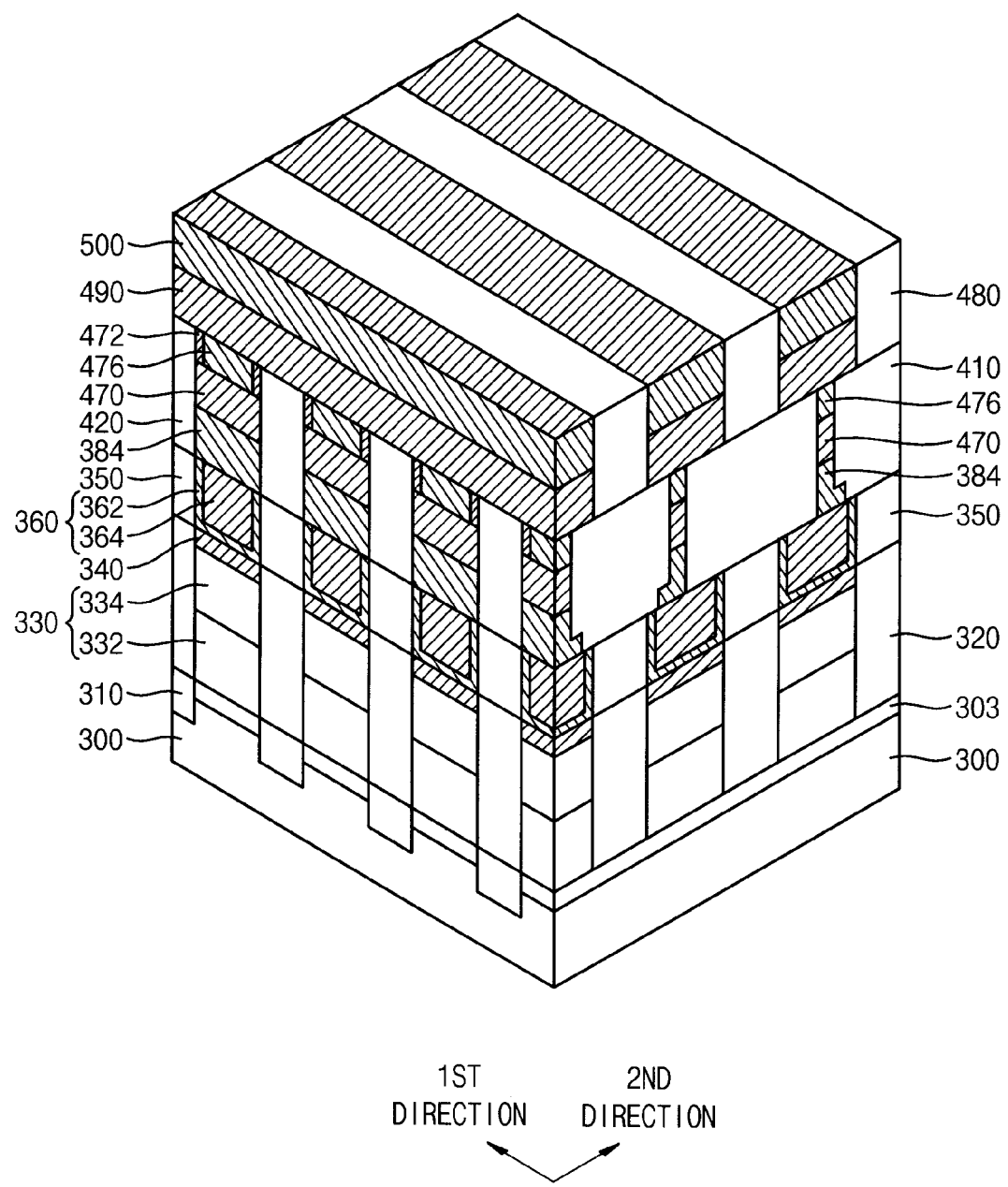

FIGS. 1 to 32 illustrate a method of manufacturing a phase change memory device in accordance with the inventive concept, and FIG. 33 is a perspective view illustrating an example of the phase change memory device. With respect to these figures, FIGS. 1, 3, 5, 7, 9, 11, 13, 15, 17, 19, 21, 23, 25, 27, 29 and 31 are cross-sectional views taken along a first direction substantially parallel to a top surface of a substrate, and FIGS. 2, 4, 6, 8, 10, 12, 14, 16, 18, 20, 22, 24, 26, 28, 30 and 32 are cross-sectional views taken along a second direction substantially parallel to the top surface of the substrate and substantially perpendicular to the first direction.

Figure 2:
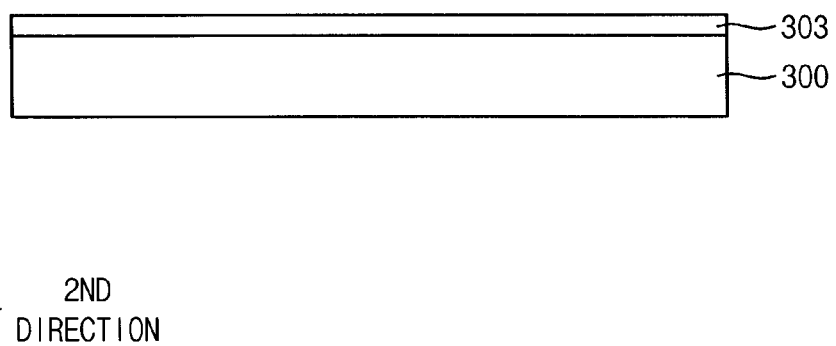

Referring to FIGS. 1 and 2, an ion implantation process may be performed on a substrate 300 to form an impurity region, and an isolation layer pattern 310 may be formed on the substrate 300 to define an active region and a field region.

The impurity region may be formed by implanting first impurities, e.g., n-type impurities such as phosphorus or arsenic, or p-type impurities such as boron or gallium, into an upper portion of the substrate 300. A well region (not shown) may be further formed under the impurity region in the substrate 300 by doping a region of the substrate 300 under the impurity regions with impurities having a conductivity type different from that of the first impurities.

In an example of this embodiment, the isolation layer pattern 310 may be formed by a shallow trench isolation (STI) process. That is, the isolation layer pattern 310 may be formed by forming trenches 305 in upper portions of the substrate 300, forming an isolation layer on the substrate 300 to sufficiently fill the trenches 305, and planarizing the isolation layer until a top surface of the substrate 300 is exposed. The isolation layer may comprise a silicon oxide, e.g., boro phospho silicate glass (BPSG), phospho silicate glass (PSG), undoped silicate glass (USG), spin on glass (SOG), flowable oxide (FOX), tetra ethyl ortho silicate (TEOS), plasma enhanced tetra ethyl ortho silicate (PE-TEOS), or high density plasma chemical vapor deposition (HDP-CVD) oxide. In embodiments according to the inventive concept, the planarization process may be performed by a chemical mechanical polishing (CMP) process and/or an etch back process.

Each isolation layer pattern 310 may be formed to extend in the second direction, and a plurality of isolation layer patterns 310 may be spaced from each other in the first direction. Thus, each active region may be also formed to extend in the second direction, and a plurality of active regions may be defined as spaced from each other in the first direction.

The isolation layer pattern 310 may be formed such that its bottom surface is disposed at a level beneath the bottom of the impurity region, and thus the impurity region may be divided into a plurality of word lines 303 by the isolation layer pattern 310. Each word line 303 may extend in the second direction, and a plurality of word lines 303 may be spaced apart in the first direction.

Figure 3:
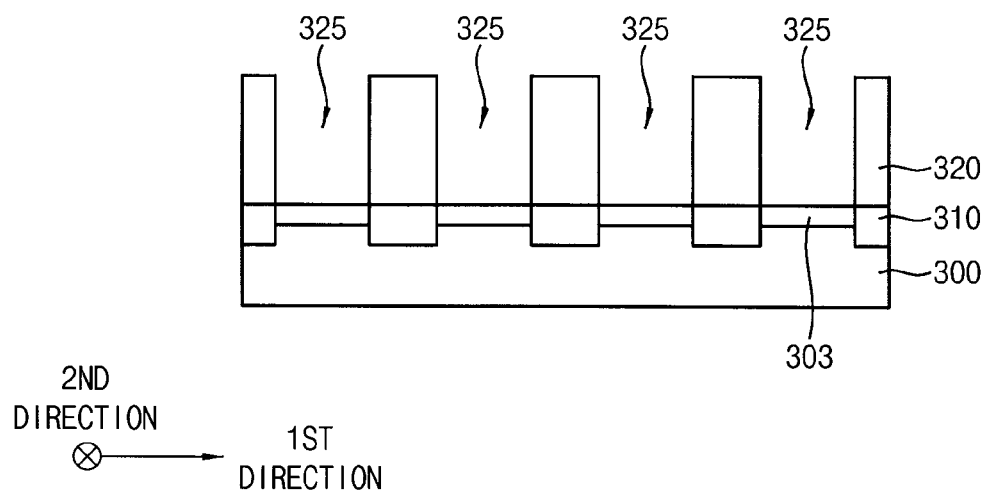
Figure 4:
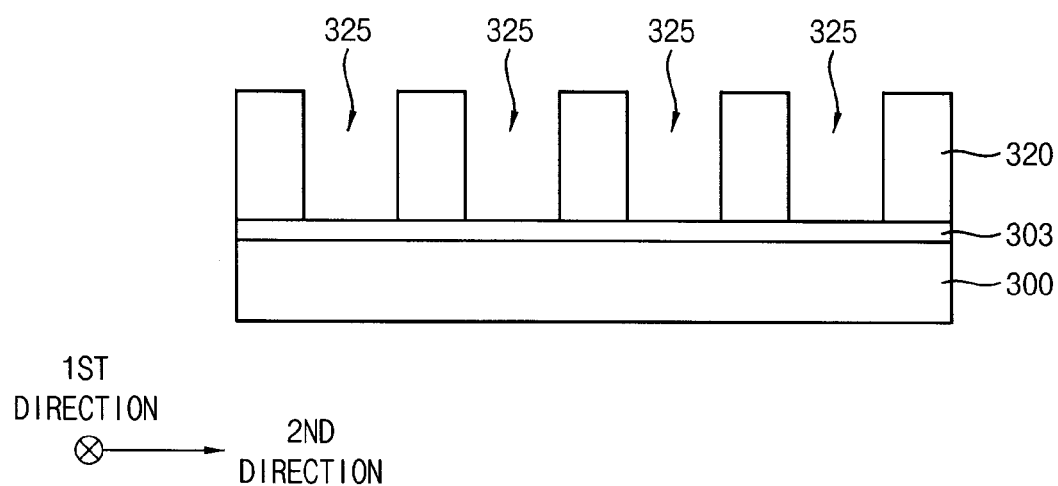

Referring to FIGS. 3 and 4, a first insulating interlayer 320 may be formed on the isolation layer pattern 310 and the word lines 303, and the first insulating interlayer 320 may be partially removed to form a plurality of first contact holes 325 exposing top surfaces of the word lines 303. In the illustrated embodiment according to the inventive concept, the first contact holes 325 are formed in both the first and second directions to form a first contact hole array.

The first contact holes 325 may be formed by anisotropically etching the first insulating interlayer 320, for example. The first insulating interlayer 320 may be formed of an oxide, e.g., silicon oxide, or a nitride. e.g., silicon nitride.

Figure 5:
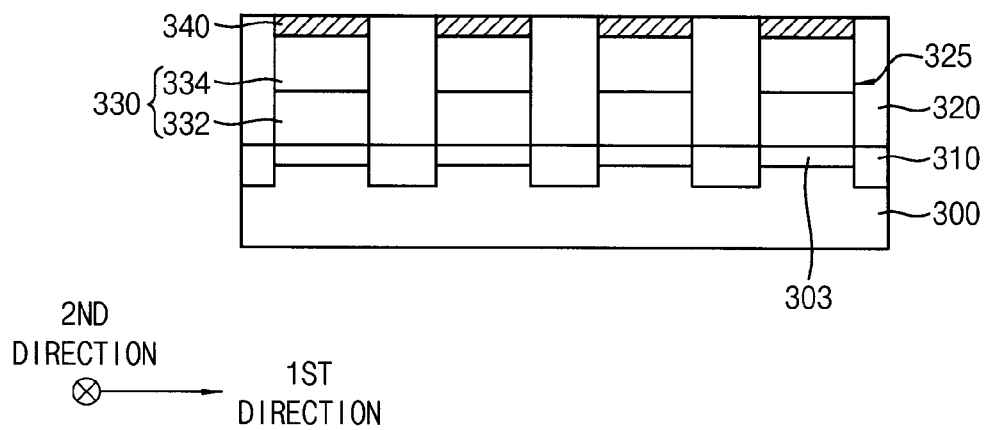
Figure 6:
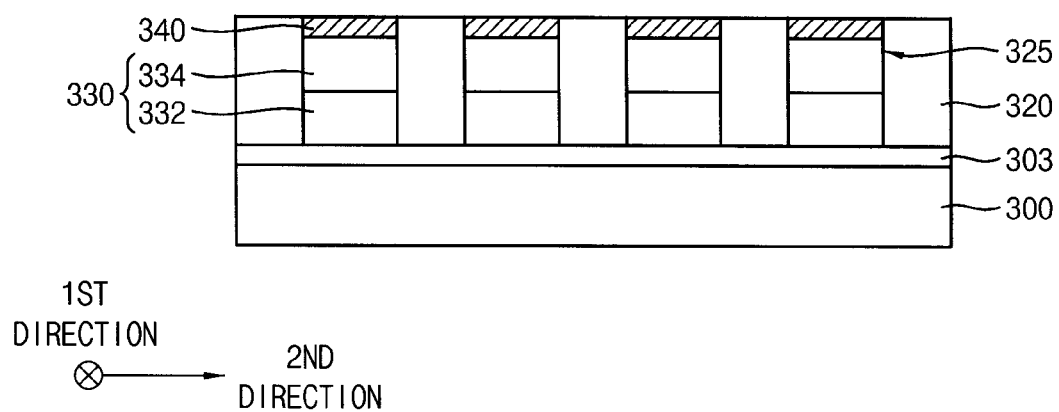

Referring to FIGS. 5 and 6, a diode 330 and an ohmic pattern 340 may be formed to fill each of the first contact holes 325.

For example, a selective epitaxial growth (SEG) process may be performed using the exposed top surfaces of the word lines 330 as a seed layer to form a silicon layer filling each of the first contact holes 325, and second and third impurities may be implanted into lower and upper portions of the silicon layer to form the diode 330. The lower portion of the silicon layer doped with the second impurities and the upper portion of the silicon layer doped with the third impurities may define a lower diode layer 332 and an upper diode layer 334, respectively. The lower diode layer 332 may contact the top surface of each of the word lines 303. In this embodiment, the second impurities may include n-type impurities, e.g., phosphorous or arsenic, and the third impurities may include p-type impurities, e.g., boron or gallium.

Before implanting the second and third impurities thereinto, a planarization process may be performed on the silicon layer so that a top surface of the diode 330 may be formed to be substantially coplanar with that of the first insulating interlayer 320.

The ohmic pattern 340 may reduce a contact resistance between the diode 330 and a subsequently formed contact plug 360 (refer to FIGS. 9 and 10), and may be formed by forming a metal layer on the diode 330 and the first insulating interlayer 320, and by performing a heat treatment of the resultant structure so that the metal layer and the diode 330 may react with each other. Any portion of the metal layer which has not reacted with the diode 330 may be removed. In examples of this embodiment according to the inventive concept, the metal layer may be formed of cobalt, nickel, or tungsten. Thus, the ohmic pattern 340 may be a metal silicide, e.g., cobalt silicide, nickel silicide, or tungsten silicide.

Alternatively, the ohmic pattern 340 may be formed by directly implanting metal ions into an upper portion of the diode 330.

A respective diode 330 and ohmic pattern 340 may be formed in each of the first contact holes 325 and thus, and a diode array of a plurality of diodes 330 and an ohmic pattern array of a plurality of ohmic patterns 340 may be formed.

In another example of this embodiment, an ohmic pattern is not formed on any of the diodes 330. That is, the forming of the ohmic patterns 340 is optional in this embodiment.

Figure 7:
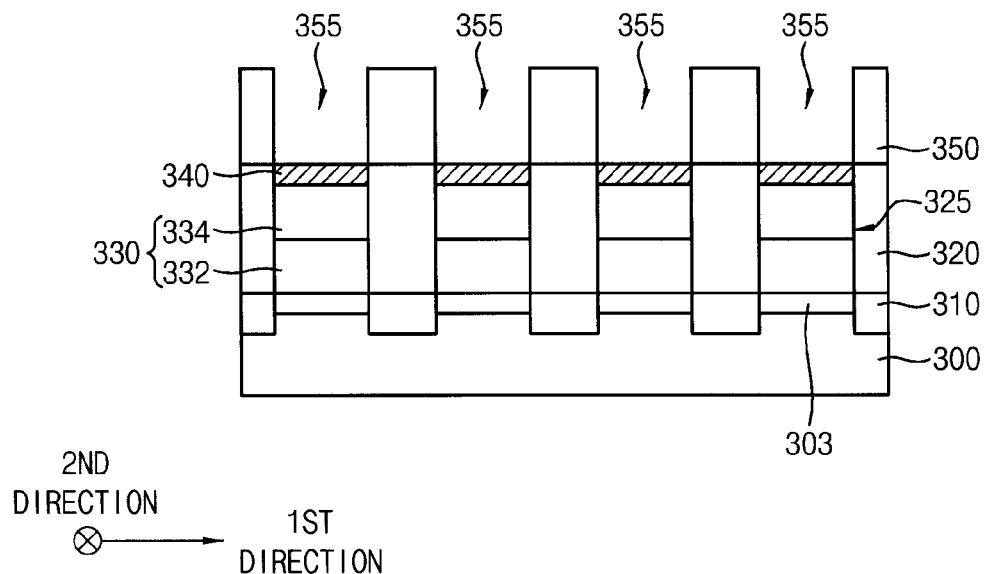
Figure 8:
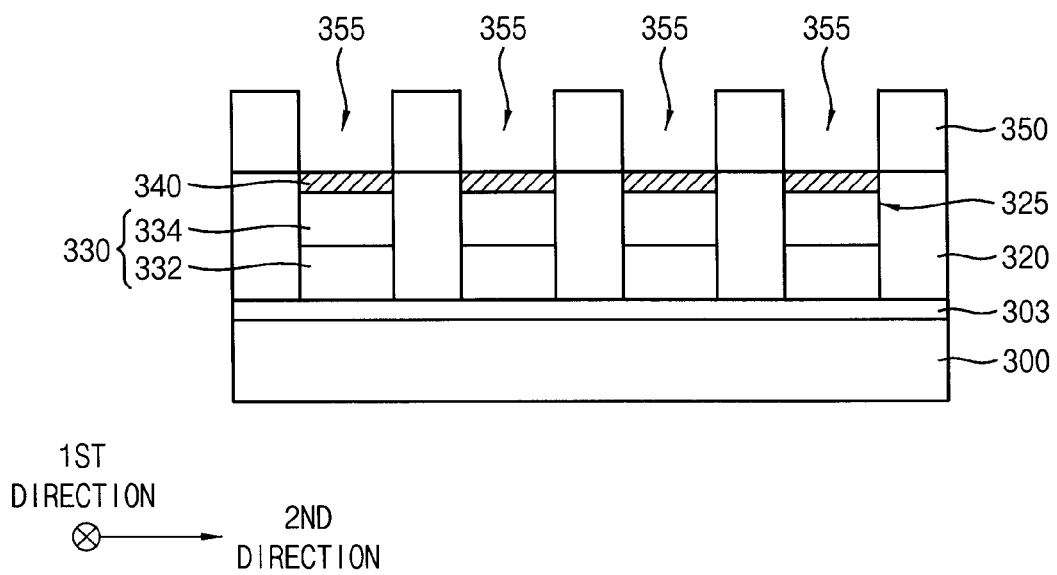

Referring to FIGS. 7 and 8, a process similar to that illustrated with reference to FIGS. 3 and 4 may be performed. Thus, a second insulating interlayer 350 may be formed on the first insulating interlayer 320 and the ohmic patterns 340, and the second insulation layer 350 may be partially removed to form a plurality of second contact holes 355 exposing the ohmic patterns 340 (or diodes), respectively.

In embodiments according to the inventive concept, the plurality of second contact holes 355 may be formed in both the first and second directions to form a second contact hole array. The second contact holes 355 may be formed by anisotropically etching the second insulating interlayer 350, for example. The second insulating interlayer 350 may be formed of an oxide, e.g., silicon oxide, or a nitride. e.g., silicon nitride.

Figure 9:
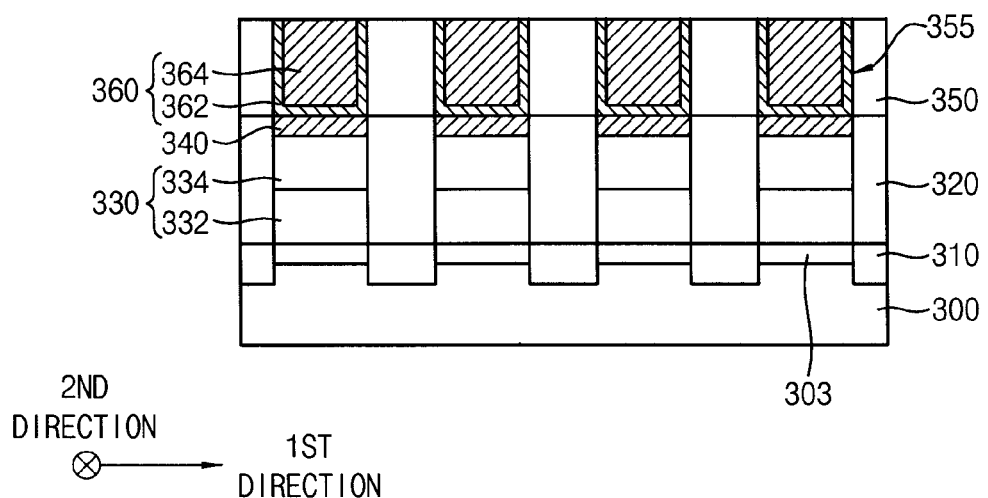
Figure 10:
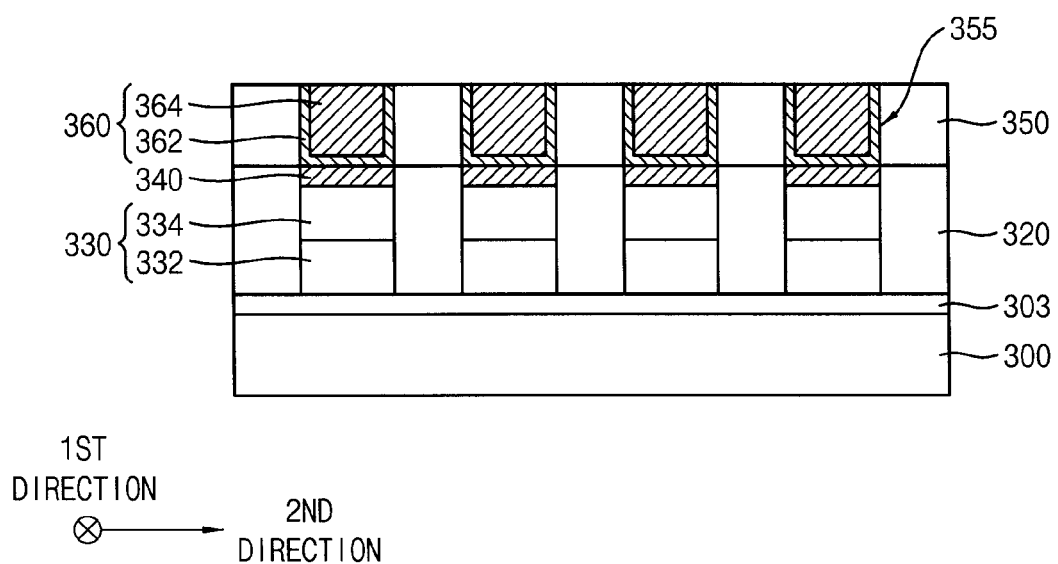

Referring to FIGS. 9 and 10, a contact plug 360 may be formed to fill each second contact hole 355. Because the second contact holes 355 define a second contact hole array, a plurality of contact plugs 360 may be formed both in the first and second directions to define a contact plug array.

The contact plugs 360 may be formed by (conformally) forming a first barrier layer on the exposed top surfaces of the ohmic patterns 340, along the sides of the second contact holes 355 and on a top surface of the second insulating interlayer 350, by forming a first conductive layer on the first barrier layer to a thickens sufficient to fill remaining portions of the second contact holes 355, and by planarizing the first conductive layer and the first barrier layer until a top surface of the second insulating interlayer 350 is exposed. Thus, each contact plug 360 may be formed to include a first barrier layer pattern 362 and a first conductive layer pattern 364, and the first barrier layer pattern 362 may surround the first conductive layer pattern 364 in the second contact hole 355.

The first barrier layer may be formed of a metal or a metal nitride, e.g., titanium or titanium nitride, and the first conductive layer may be formed of a low resistance metal, e.g., copper, tungsten or aluminum.

In another example, the contact plugs 360 are not be formed. That is, the forming of the contact plugs 360 is optional in this embodiment.

Figure 11:
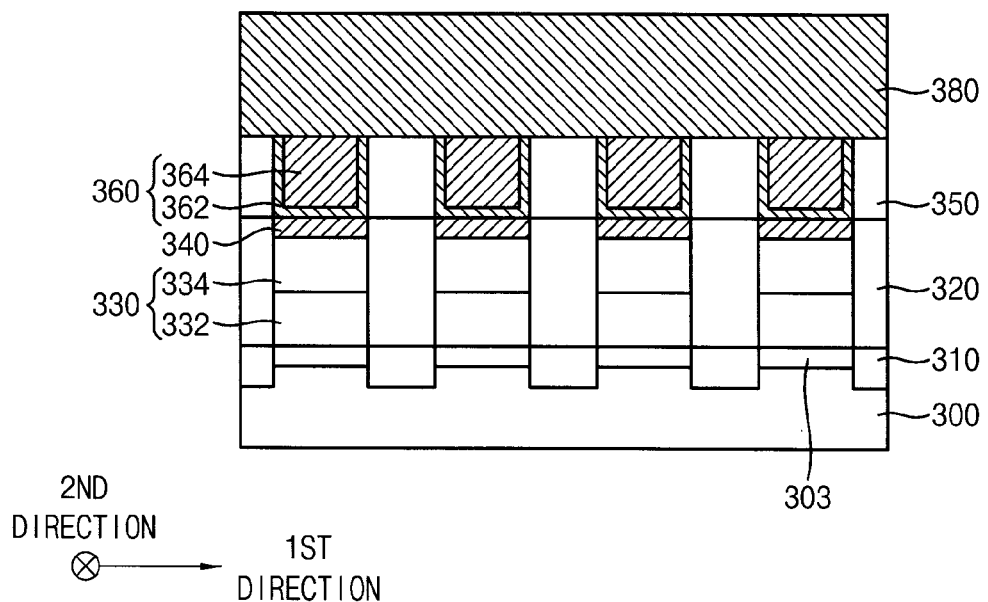
Figure 12:
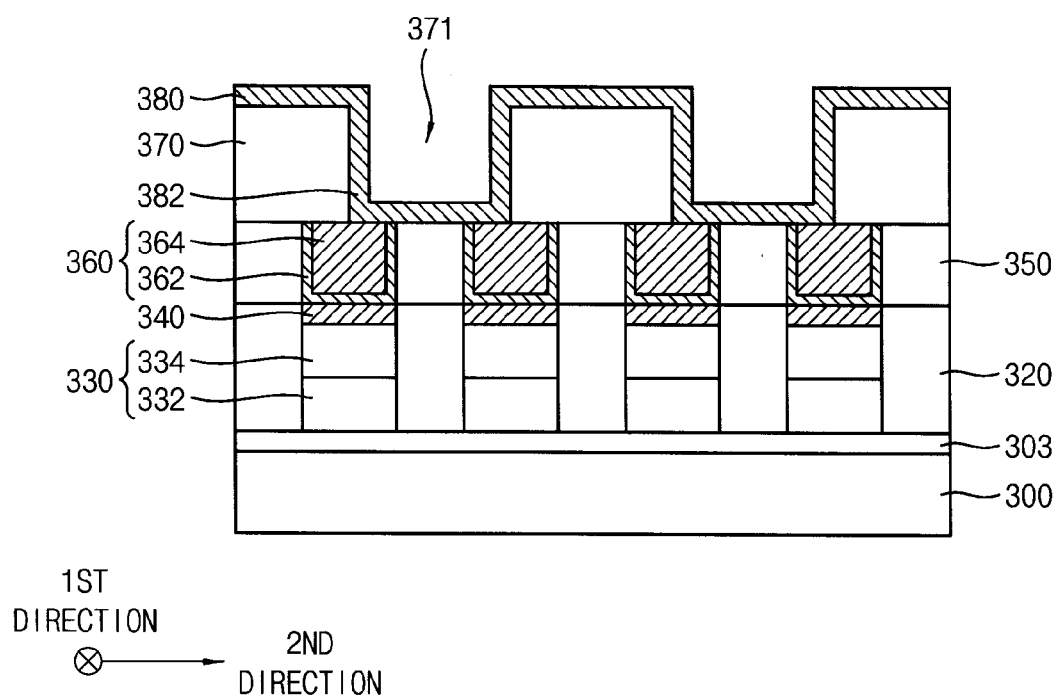

Referring to FIGS. 11 and 12, a third insulating interlayer 370 may be formed on the second insulating interlayer 350 and the contact plugs 360, the third insulating interlayer 370 may be partially removed to form a first opening 371 exposing top surfaces of the contact plugs 360 and the second insulation layer 350, and a lower electrode layer 380 may be formed on the exposed top surfaces of the contact plugs 360 and the second insulating interlayer 350, along sides of the first opening 371, and on a top surface of the third insulating interlayer 370.

In an example of this embodiment according to the inventive concept, each first opening 371 may be formed to extend in the first direction, and a plurality of first openings 371 may be formed so as to be spaced from each other in the second direction. Top surfaces of two respective contact plugs 360 adjacent to each other in the second direction may be exposed by the same first opening 371.

The lower electrode layer 380 may be formed to of a metal or a metal compound such as a metal nitride or a metal silicon nitride. In an example of this embodiment, the lower electrode layer 380 is conformally formed so as to extend along the exposed top surfaces of the contact plugs 360 and the second insulating interlayer 350, the sides of the first opening 371, and the top surface of the third insulating interlayer 370.

The third insulating interlayer 370 may be formed to of an oxide, e.g., silicon oxide, or a nitride, e.g., silicon nitride.

Figure 13:
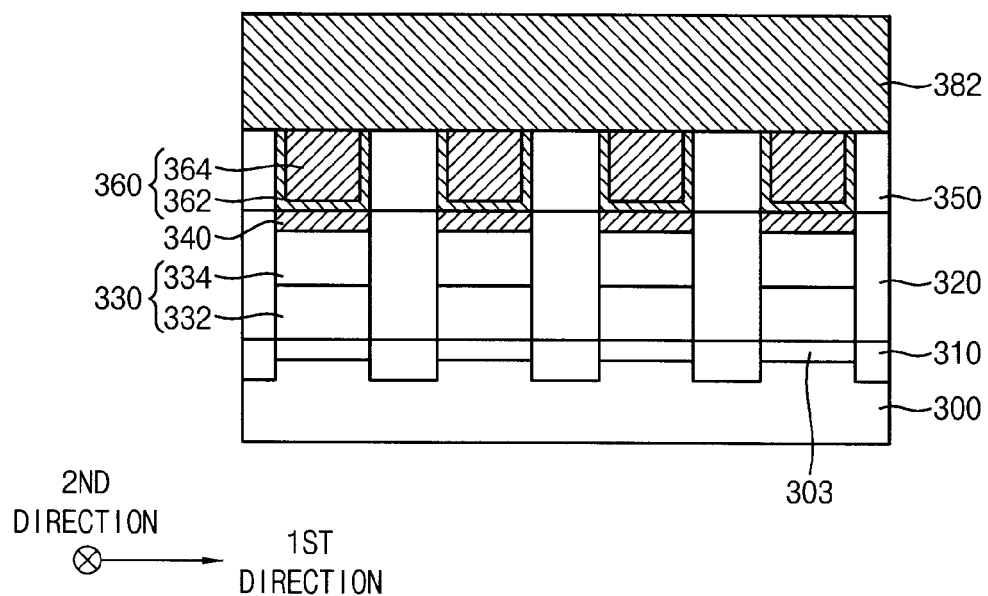
Figure 14:
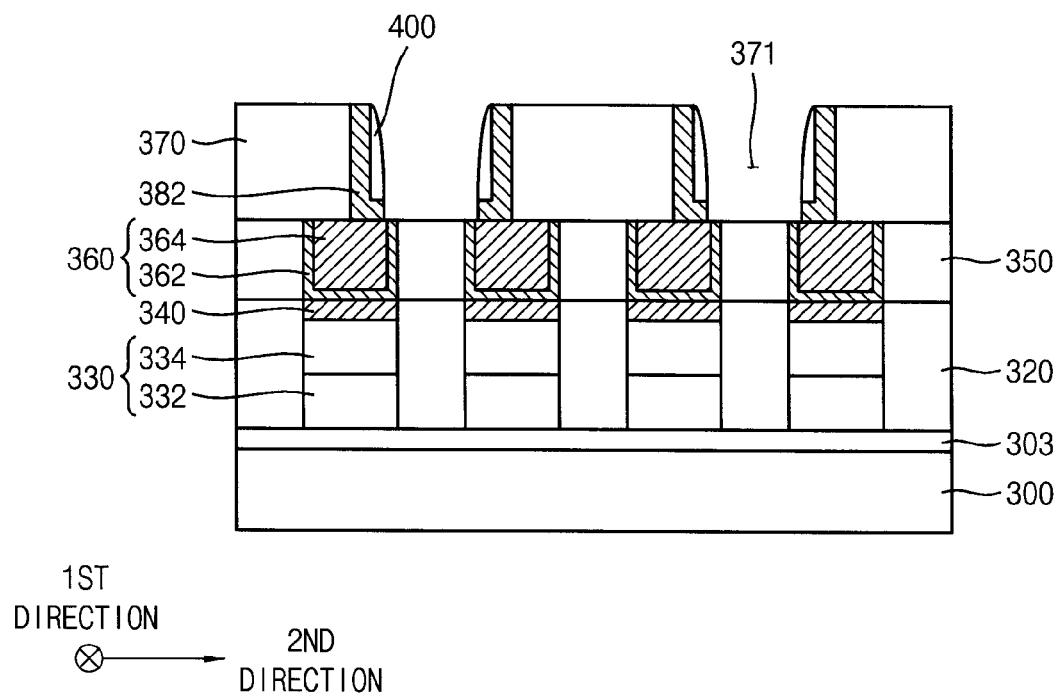

Referring to FIGS. 13 and 14, a spacer 400 may be formed on the lower electrode layer 380, and the lower electrode layer 380 may be partially removed using the spacer 400 as an etching mask to form a lower electrode layer pattern 382.

The spacer 400 may be formed by forming a spacer layer on the lower electrode layer 380, and anisotropically etching the spacer layer. Thus, the spacer 400 may extend in the first direction, and a plurality of spacers 400 may be formed as spaced from each other in the second direction. In an example of this embodiment according to the inventive concept, two spacers 400 are formed in each first opening 371.

The lower electrode layer pattern 382 may be formed to extend in the first direction along a side of the first opening 371, and a plurality of lower electrode layer patterns 382 may be formed as spaced from each other in the second direction. Each lower electrode layer pattern 382 may have an "L" or a "J-like" shaped cross section, in the second direction. That is, the lower electrode layer pattern 382 may be formed to extend conformally on a side of the first opening 371 and the exposed top surface of a contact plug 360. Thus, the contact area between the lower electrode layer pattern 382 and a subsequently formed third phase change material layer pattern 470 (refer to FIGS. 29 and 30) may be relatively small as compared to the contact area between the lower electrode layer pattern 382 and the contact plug 360 so that the third phase change material layer pattern 470 may be efficiently heated even with a small current.

The spacer layer may be formed of an oxide, e.g., silicon oxide, or a nitride, e.g., silicon nitride.

Figure 15:
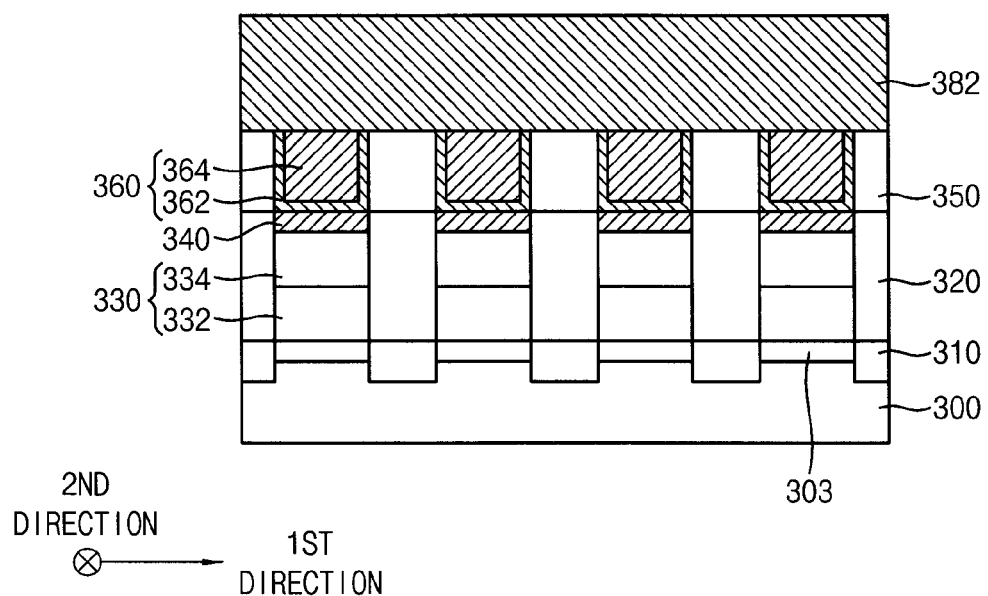
Figure 16:
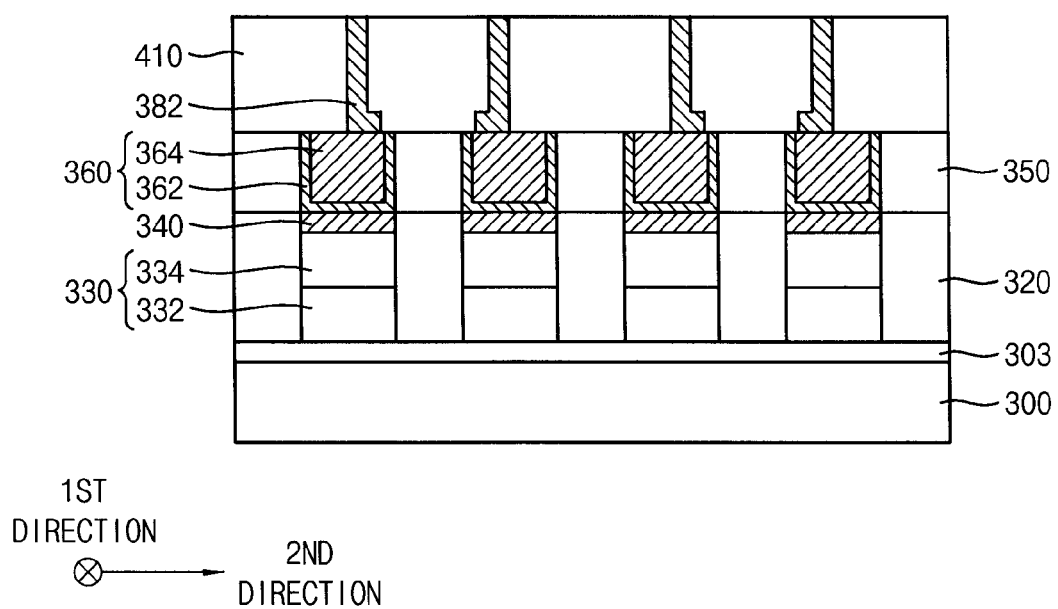

Referring to FIGS. 15 and 16, a fourth insulating interlayer 410 filling the remaining portion of the first openings 371 may be formed on the exposed top surfaces of the contact plugs 360 and the second insulating interlayer 350, the spacers 400, the lower electrode layer patterns 382, and a top surface of the third insulating interlayer 370, and may be planarized until top surfaces of the lower electrode layer patterns 382 are exposed.

The fourth insulating interlayer 410 may be formed of an oxide, e.g., silicon oxide, or a nitride, e.g., silicon nitride, and may be formed of substantially the same material as those forming the spacer 400 and the third insulating interlayer 370. In this case, the materials of the fourth insulating interlayer 410, the spacer 400 and the third insulating interlayer 370 merge, and hereinafter, the merged materials will be referred to simply as a fourth insulating interlayer 410. The fourth insulating interlayer 410 may extend around the lower electrode layer patterns 382 and on the contact plugs 360 and the second insulating interlayer 350.

Figure 17:
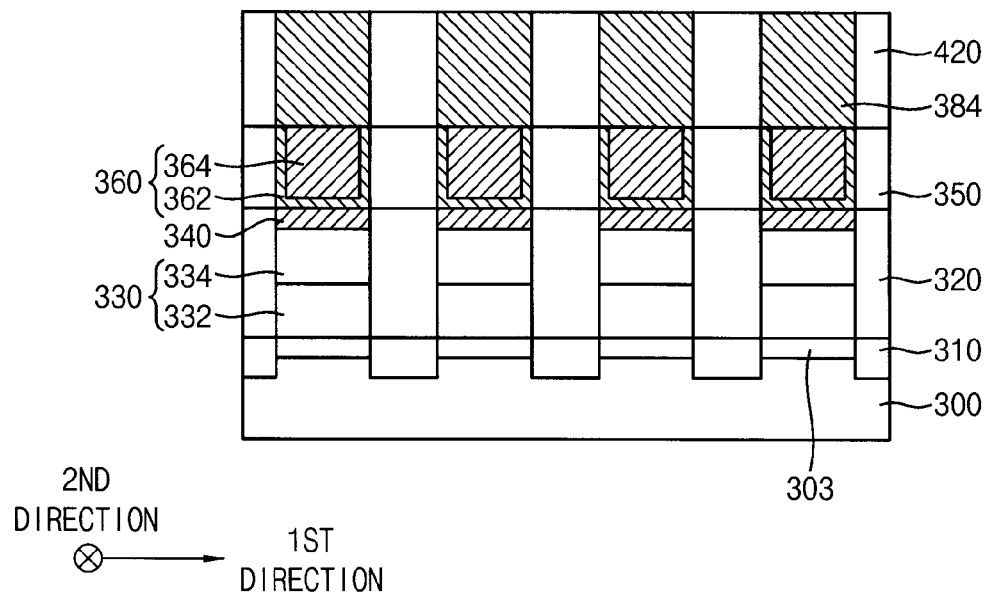
Figure 18:
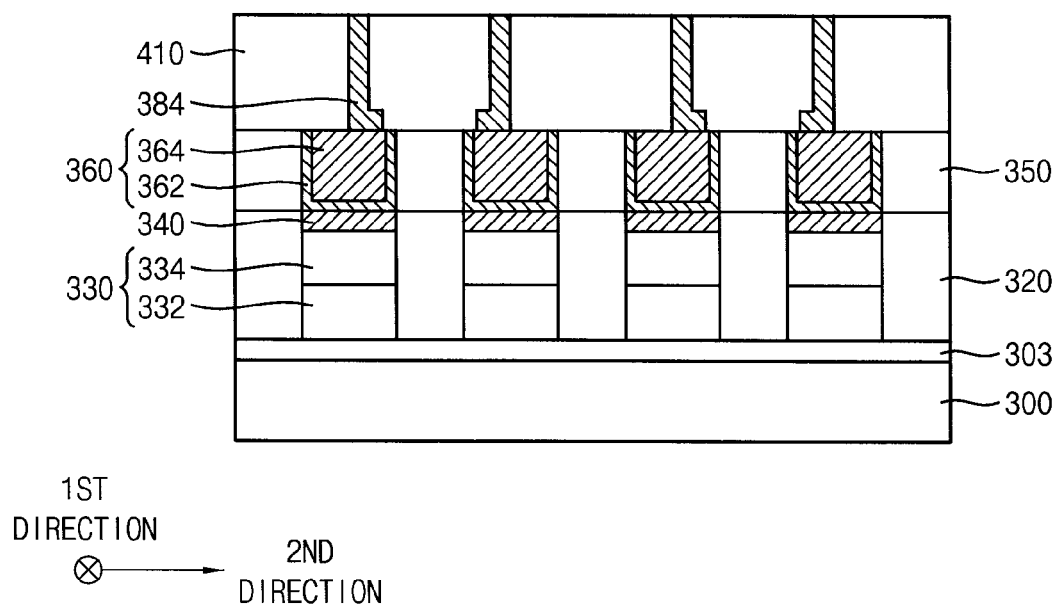

Referring to FIGS. 17 and 18, the lower electrode layer pattern 382 may be partially removed using a photoresist pattern (not shown) having linear segments extending in the second direction as an etching mask to form a plurality of lower electrodes 384 spaced from each other in the first direction. As a result, the plurality of lower electrodes 384 may be formed in both the first and second directions to provide a lower electrode array.

When the lower electrode layer pattern 382 is etched, the fourth insulating interlayer 410 may be partially etched to form second openings (not shown), and a fifth insulating interlayer 420 may be formed to fill the second openings.

Figure 19:
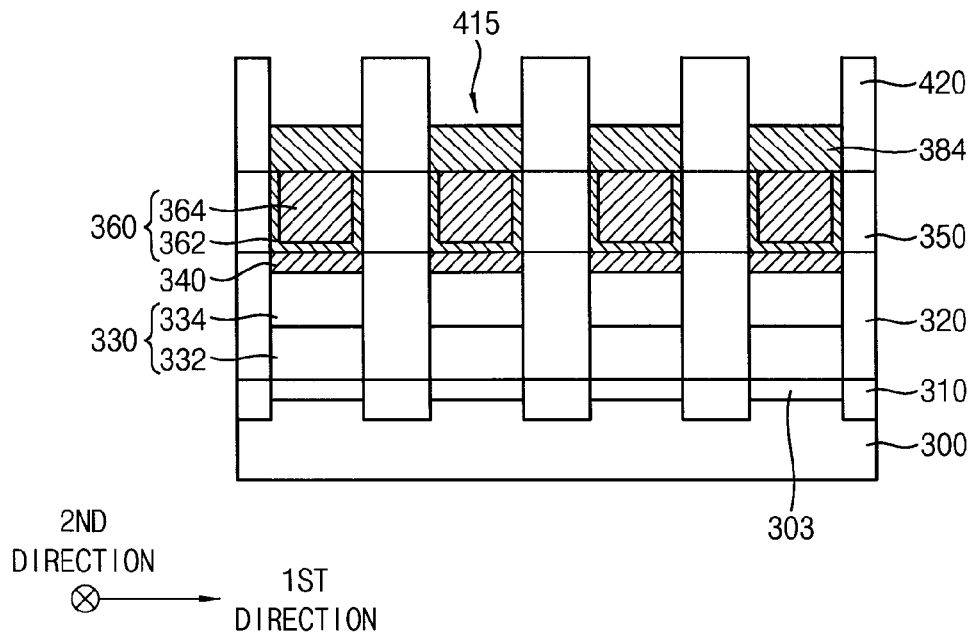
Figure 20:
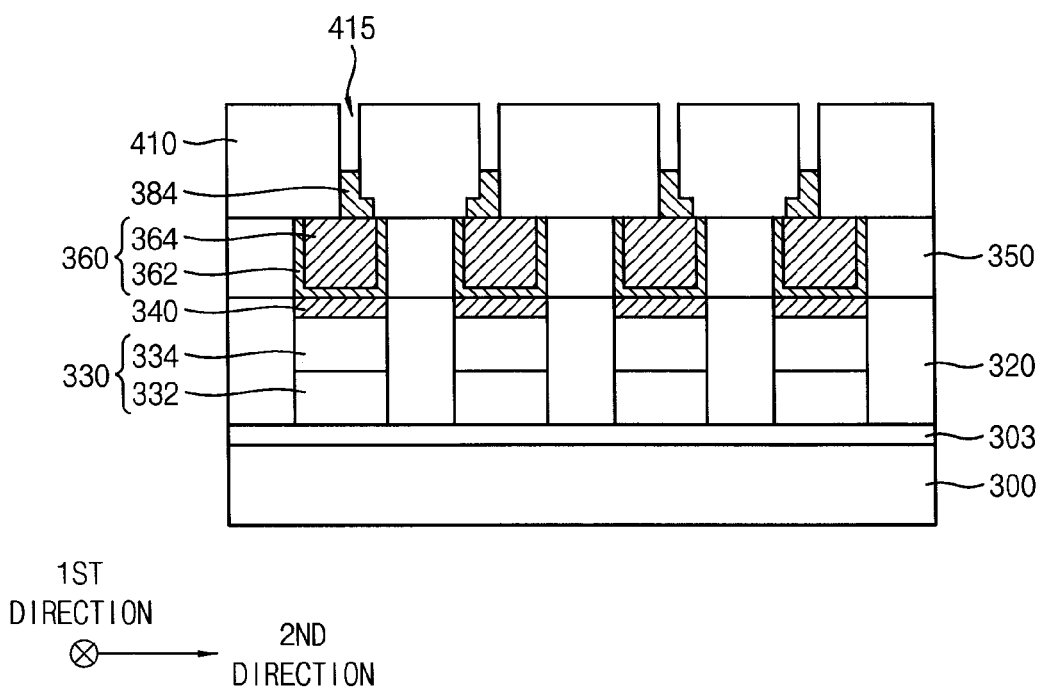

Referring to FIGS. 19 and 20, an upper portion of each lower electrode 384 may be removed to form a recess 415.

In an example of this embodiment according to the inventive concept, the upper portions of the lower electrodes 384 are removed by a wet etching process. As a result, recesses 415 are formed in both the first and second directions to produce a recess array.

Figure 21:
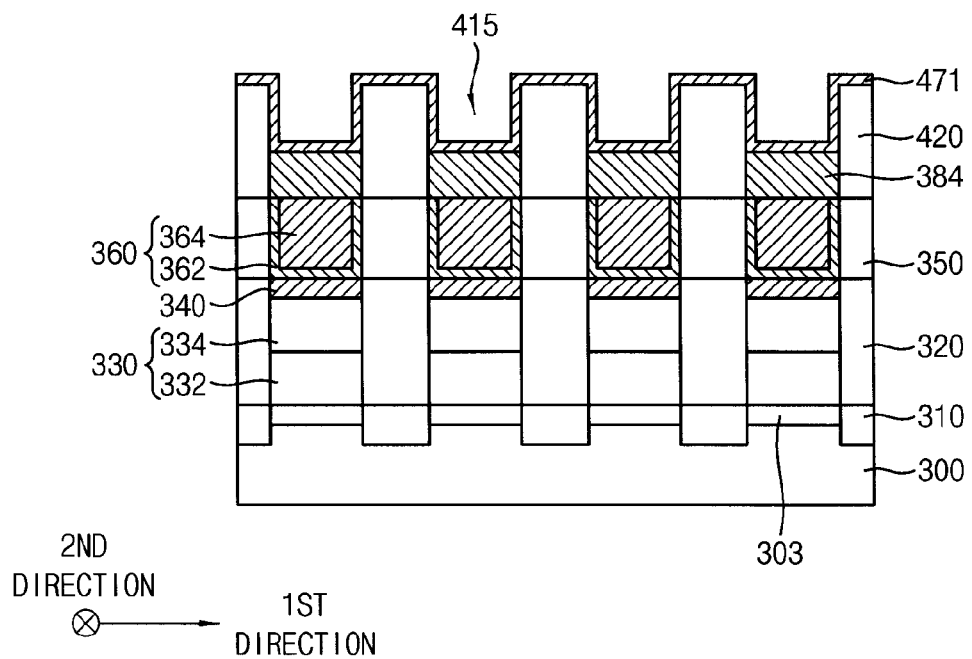
Figure 22:
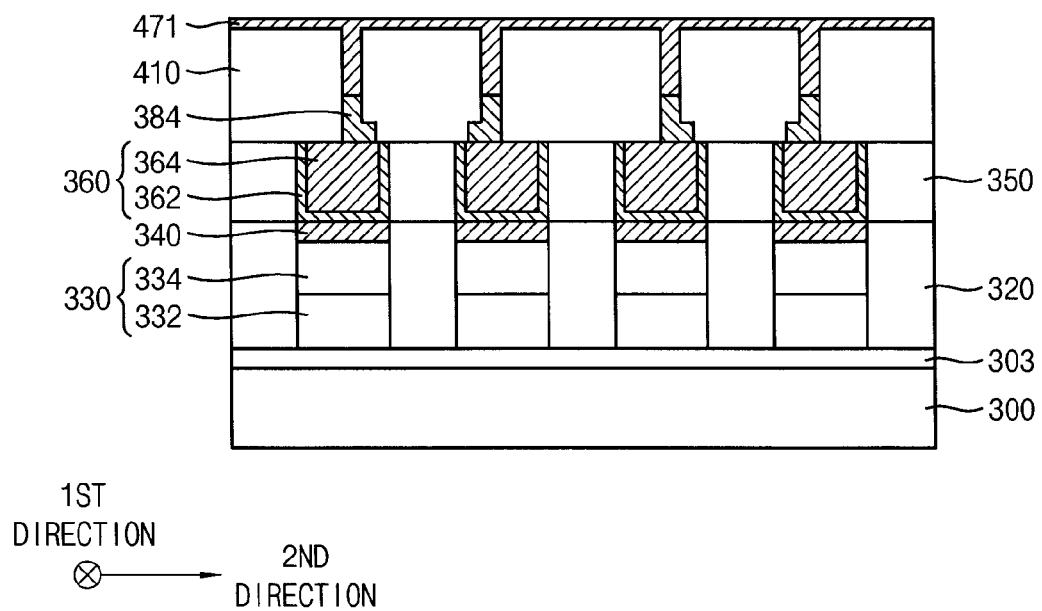

Referring to FIGS. 21 and 22, a first phase change material layer 471 is conformally formed on the structure having the recesses 415. Thus, the first phase change material layer 471 may contact top surfaces of the lower electrodes 384, and may partially fill the recesses 415, and may contact top surfaces of the fourth and fifth insulating interlayers 410 and 420.

The first phase change material layer 471 may be formed by providing a first deposition source (or precursor) comprising a chalcogen compound, e.g., GeSbTe (GST), on the substrate 300 at a first temperature. The first deposition source may further include at least one element from the group consisting of carbon, boron, nitrogen, oxygen, silicon, indium, bismuth, phosphorus, sulfur, aluminum, gallium, arsenic, selenium, zirconium, cadmium, tin, and polonium. The element may be present at about 20 weight percent or less in the first deposition source. The first deposition source may be volatilized at the first temperature, and the first temperature varies depending on the composition of the first deposition source.

In an example of this embodiment according to the inventive concept, the first deposition source is provided on the substrate 300 by a physical vapor deposition (PVD) process. Thus, the first phase change material layer 471 may have excellent step coverage, and may be conformally formed on the sides of the recesses 415 to a uniform thickness, i.e., without any portion overhanging the recess.

Figure 23:
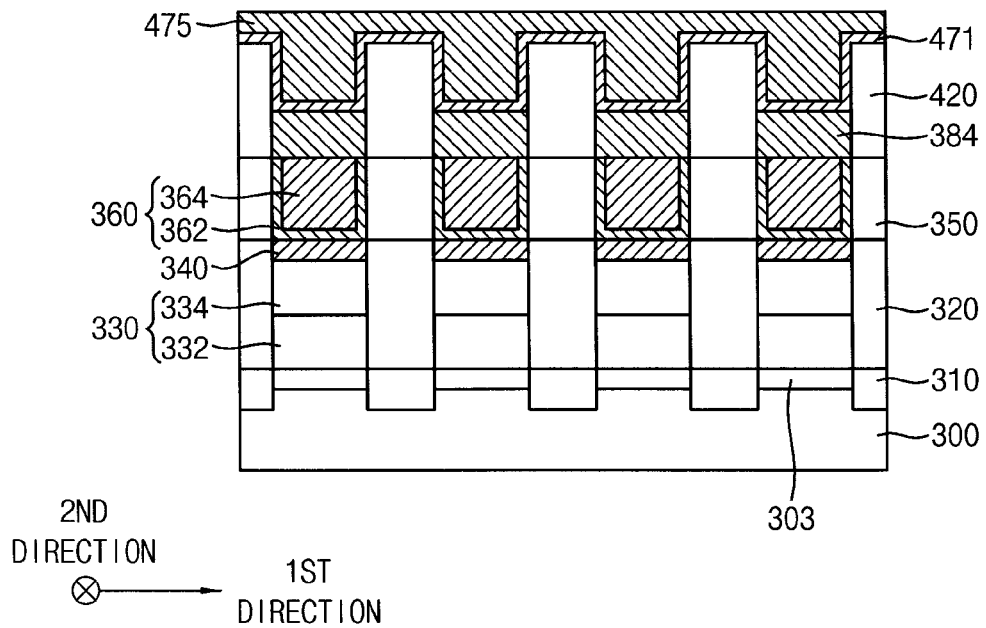
Figure 24:
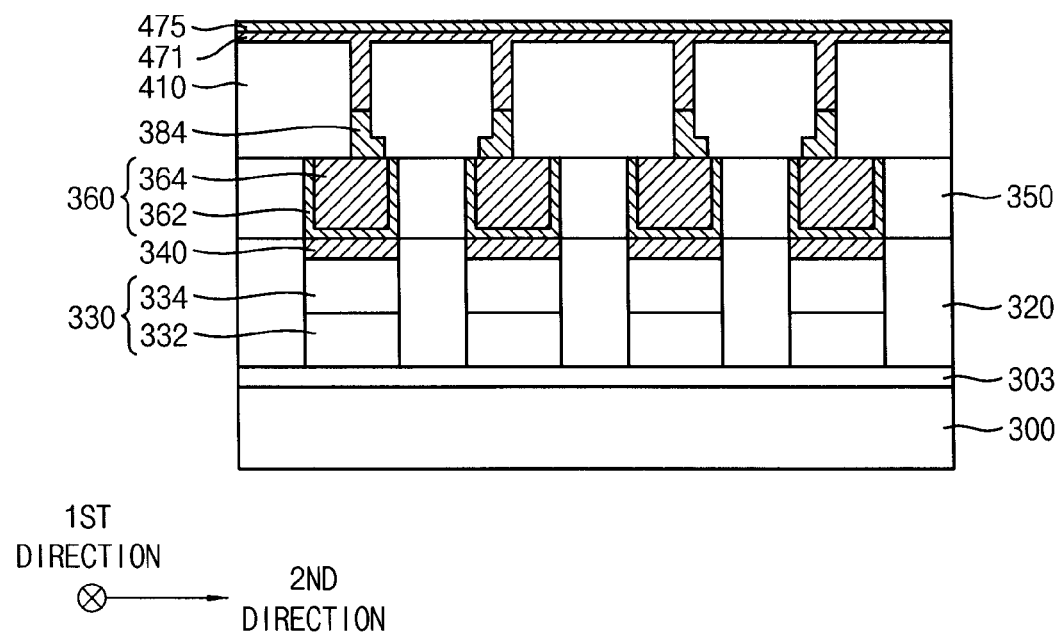

Referring to FIGS. 23 and 24, a second phase change material layer 475 having a composition different from the composition of the first phase change material layer 471 is formed on the first phase change material layer 471 to fill remaining portions of the recesses 415. Thus, the second phase change material layer 475 in this embodiment may be a blanket layer. In an example of this embodiment according to the inventive concept, the second phase change material layer 475 includes germanium at a concentration less than the concentration of germanium in the first phase change material layer 471, and is formed to a thickness greater than the thickness to which the first phase change material layer 471 is formed.

The second phase change material layer 475 may be formed by providing onto the substrate 300 a second deposition source (or precursor), including a chalcogen compound, e.g., GeSbTe (GST), and at least one element selected from the group consisting of carbon, boron, nitrogen, oxygen, silicon, indium, bismuth, phosphorus, sulfur, aluminum, gallium, arsenic, selenium, zirconium, cadmium, tin, and polonium, but whose composition (e.g., ratio of elements making up the second deposition source) is different from that of the first deposition source. The second deposition source may be provided on the substrate 300 at a second temperature at which the second deposition source is volatilized, and the second temperature varies depending on the composition of the second deposition source. In this embodiment according to the inventive concept, the second temperature is higher than the first temperature so that the second phase change material layer 475 may fill remaining portions of the recesses 415.

The second deposition source may be provided onto the substrate 300 by a chemical vapor deposition (CVD) process or an atomic layer deposition (ALD) process. Thus, the second phase change material layer 475 may have an excellent gap-fill characteristic so that a void will not be formed in the second phase change material layer 475.

Figure 25:
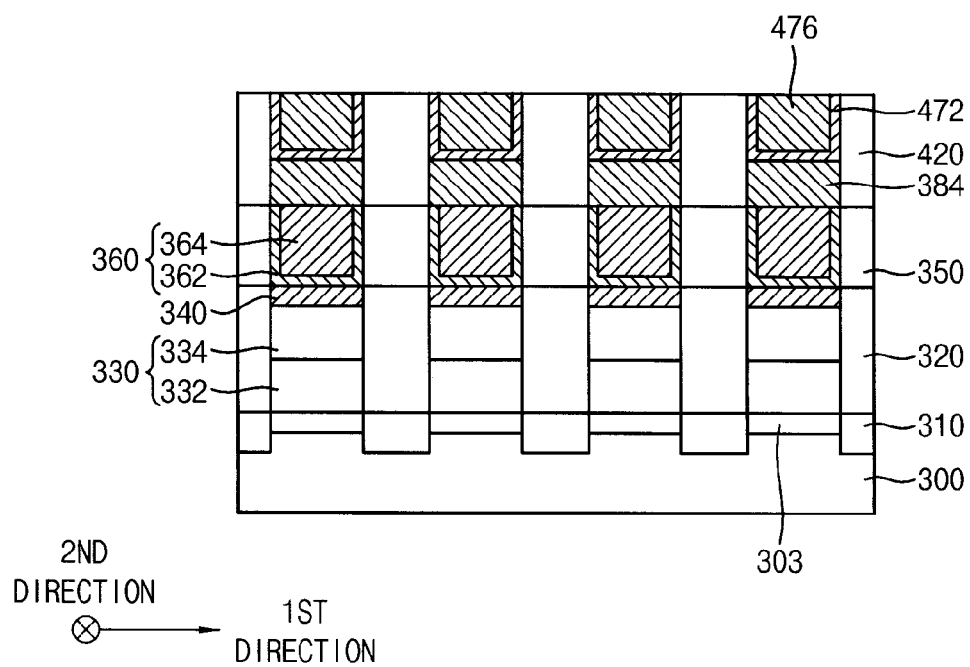
Figure 26:
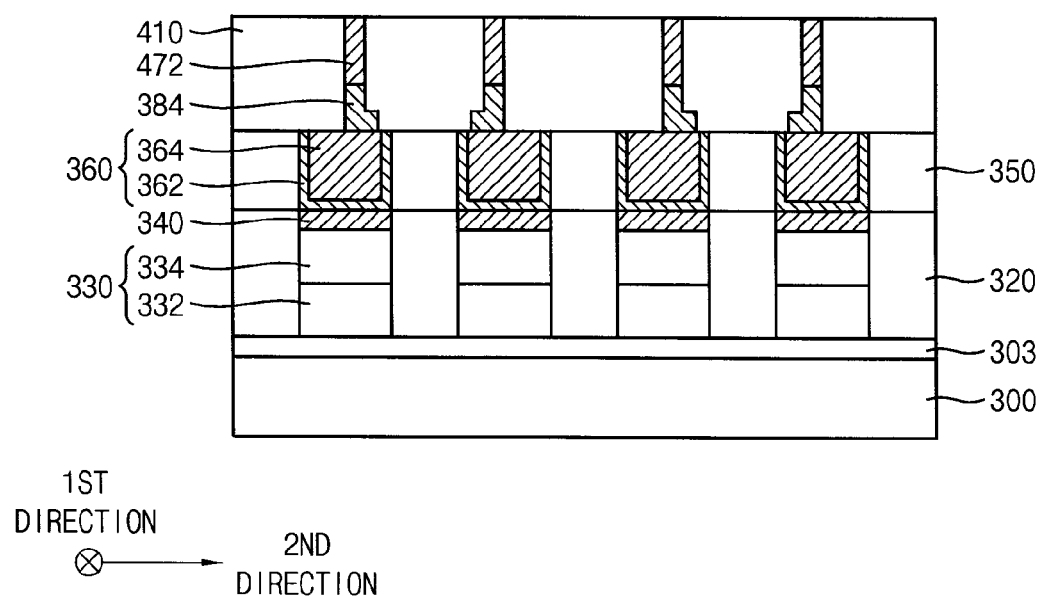

Referring to FIGS. 25 and 26, the first and second phase change material layers 471 and 475 may be planarized until top surfaces of the fourth and fifth insulating interlayers 410 and 420 are exposed. Thus, a second phase change material layer pattern 476 and a first phase change material layer pattern 472 surrounding the second phase change material layer pattern 476 in each of the recesses 415 may be formed. In the present embodiment according to the inventive concept, a plurality of such first phase change material layer patterns 472 and second phase change material layer patterns 476 are formed in both the first and second directions to provide a first phase change material layer pattern array and a second phase change material layer pattern array, respectively.

Typically, the greater the concentration of germanium in a chalcogen compound is the higher is the degree of crystallization of the compound. Furthermore, the higher the degree of crystallization the more difficult it may be to planarize a chalcogen compound. In an example of this embodiment according to the inventive concept, although the second phase change material layer 475 is thicker than the first phase change material layer 471 its germanium concentration is less than that of the first phase change material layer 471. Thus, the first and second phase change material layers 471 and 475 may be easily planarized so as to be completely removable from the fourth and fifth insulating interlayers 410 and 420. Therefore, the device is not prone to electrical shorts which may otherwise occur if residue of the first and second phase change material layers 471 and 475 were left on the fourth and fifth insulating interlayers 410 and 420.

Figure 27:
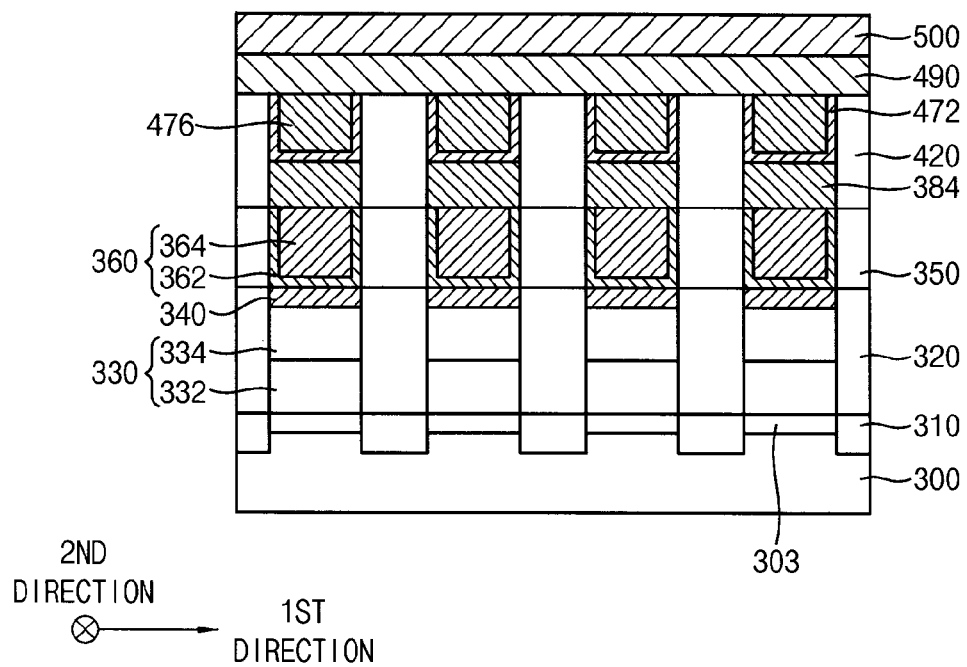
Figure 28:
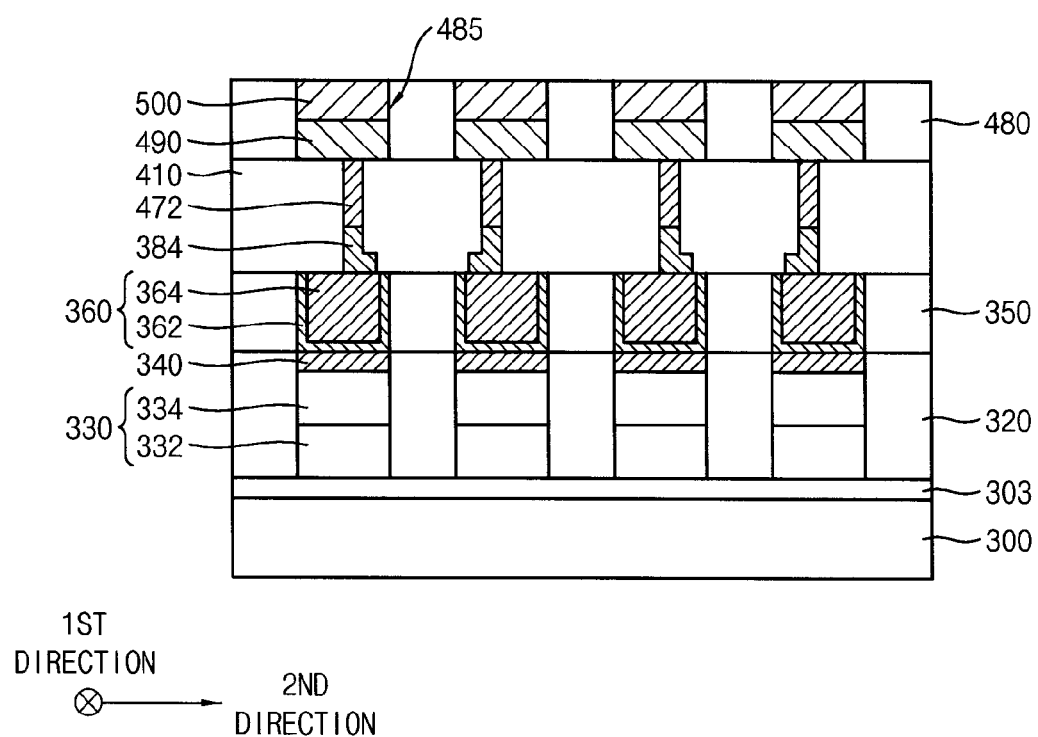

Referring to FIGS. 27 and 28, an upper electrode 490 and a bit line 500 may be sequentially formed on the first and second phase change material layer patterns 472 and 476 as electrically connected thereto.

The upper electrode 490 may be formed by forming a sixth insulating interlayer 480, having third openings 485 therethrough exposing top surfaces of the first and second phase change material layer patterns 472 and 476, on the fourth and fifth insulating interlayers 410 and 420, forming a second conductive layer on the exposed top surfaces of the first and second phase change material layer patterns 472 and 476 and the sixth insulating interlayer 480 to sufficiently fill the third openings 485, planarizing the second conductive layer until a top surface of the sixth insulating interlayer 480 is exposed, and removing an upper portion of the planarized second conductive layer. Thus, the upper electrode 490 may partially fill each of the third openings 485 and directly contact top surfaces of the first and second phase change material layer patterns 472 and 476.

The third openings 485 may be formed as spaced from each other in the second direction, and each of the third openings 485 may extend in the first direction. Thus, each upper electrode 490 may also extend in the first direction, and a plurality of upper electrodes 490 may be formed as spaced apart in the second direction to provide an upper electrode array.

The bit line 500 may be formed by forming a third conductive layer on top surfaces of the upper electrodes 490 and the sixth insulating interlayer 480 to a thickness sufficient to fill remaining portions of the third openings 485, and by planarizing the third conductive layer until the top surface of the sixth insulating interlayer 480 is exposed. Thus, the bit line 500 may directly contact the top surfaces of the upper electrodes 490, and may extend in the first direction. Additionally, a plurality of bit lines 500 may be formed as spaced from each other in the second direction.

The second and third conductive layers may be formed of a metal, a metal nitride, a metal silicide or the like. The sixth insulating interlayer 480 may be formed of an oxide, e.g., silicon oxide, or a nitride, e.g., silicon nitride. In an example of this embodiment, the bit line 500 is formed to include a second barrier layer pattern (not shown) of a metal nitride.

Figure 29:
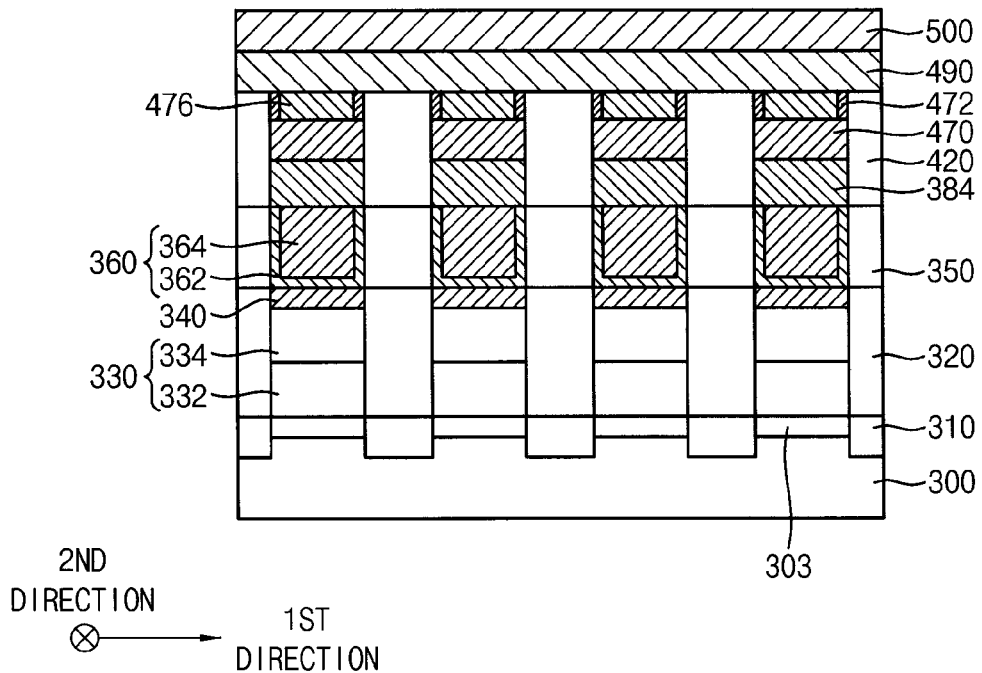
Figure 30:
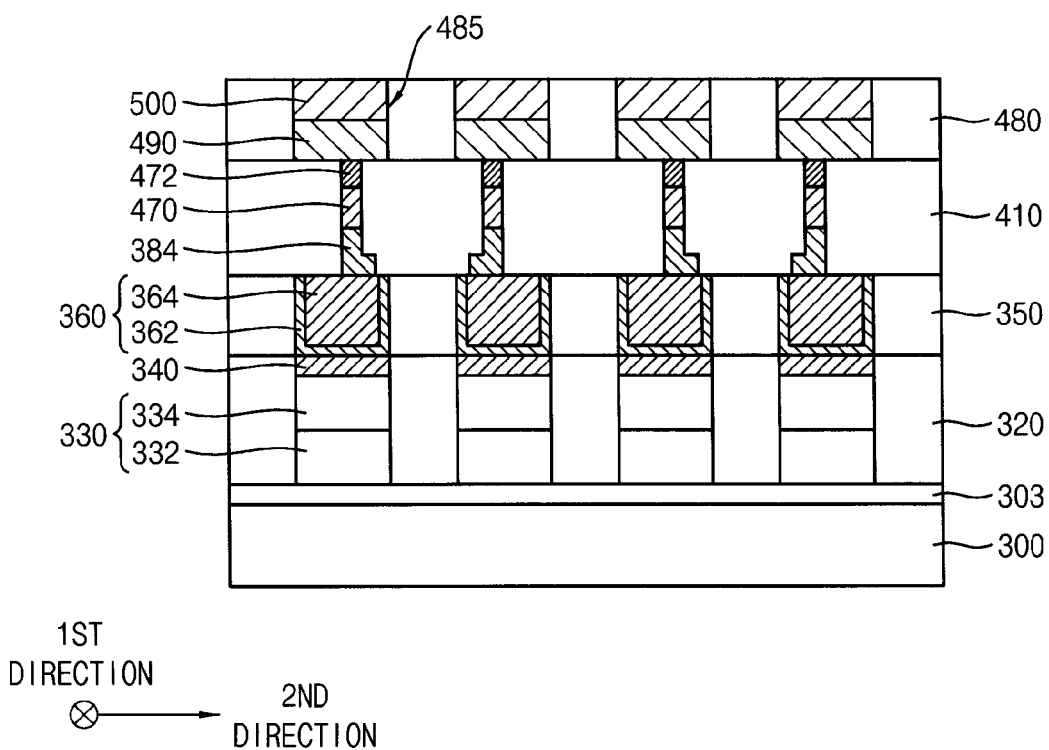

Referring to FIGS. 29, 30 and 33, energy is applied to the first and second phase change material layer patterns 472 and 476 to form a mixed phase change material layer pattern, namely, a third phase change material layer pattern 470, including a mixture of elements (at least one each) from both the first and second phase change material layer patterns 472 and 476. Thus, each third phase change material layer pattern 470 may fill at least part of a recess 415. In the example shown in FIGS. 29 and 30, each third phase change material layer pattern 470 fills only part of a recess 415. In the example shown in FIGS. 31 and 32, the third phase change material layer pattern 470 fills the recesses 415. And in examples in which a plurality of the first phase change material layer patterns 472 and a plurality of the second phase change material layer patterns 476 are formed in both the first and second directions, a plurality of third phase change material layer patterns 470 are also formed in both the first and second directions to provide a third phase change material layer pattern array.

In an example of this process according to the inventive concept, the third phase change material layer pattern 470 may be formed by supplying current to the first and second phase change material layer patterns 472 and 476. That is, the phase change material layer patterns 472 and 476 are connected to a source of current via, for example, the word lines 303 and the bit lines 500. The elements of the first and second phase change material layer patterns 472 and 476 may be mixed to a desired degree by controlling the amount of current supplied. In any case, the first and second phase change material layer patterns 472 and 476 may be crystallized by the current, in a state in which the elements thereof become mixed. Thus, the third phase change material layer pattern 470 may be formed to have a composition (e.g., ratio of elements) different from each of the compositions of the first and second phase change material layer patterns 472 and 476. For example, the germanium concentration of the third phase change material layer pattern 470 may be less than that of the first phase change material layer pattern 472 but greater than that of the second phase change material layer pattern 476.

In working examples of this embodiment, the third phase change material layer pattern 470 may be formed to have a germanium concentration of about 0.01 weight percent to about 8 weight percent. Thus, the phase change memory device may have an enhanced operation speed.

Alternatively, the third phase change material layer pattern 470 may be formed to have a germanium concentration of about 15 weight percent to about 99 weight percent. In this case, the phase change memory device may have enhanced refresh characteristics.

As described above, the first and second phase change material layer patterns 472 and 476 having compositions of similar elements but at different ratios (in terms of weight %) may be sequentially formed, and a current may be supplied thereto, so that the third phase change material layer pattern 470 having a desired composition may be easily formed from the elements constituting the first and second phase change material layer patterns 472 and 476.

Also, the first phase change material layer pattern 472 may be formed to have a relatively high germanium concentration so as to provide excellent step coverage, whereas the second phase change material layer pattern 476 may be formed to have a relatively low germanium concentration so as to possess excellent gap-fill characteristics and facilitate the subsequent planarization process. Thus, the first, second and third phase change material layer patterns 472, 476 and 470 may be formed without containing voids, and without producing an overhang. Additionally, the planarization process does not leave any residue of phase change material, i.e., provides clearly separated nodes. Accordingly, the device will not be prone to exhibiting electrical shorts.

Figure 42:
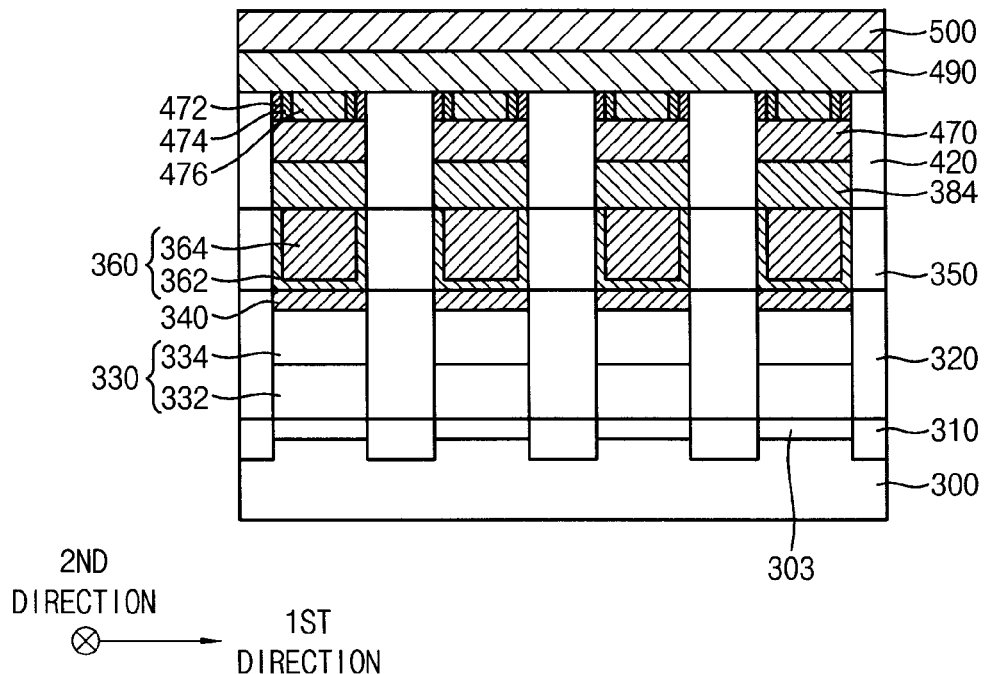
Figure 43:
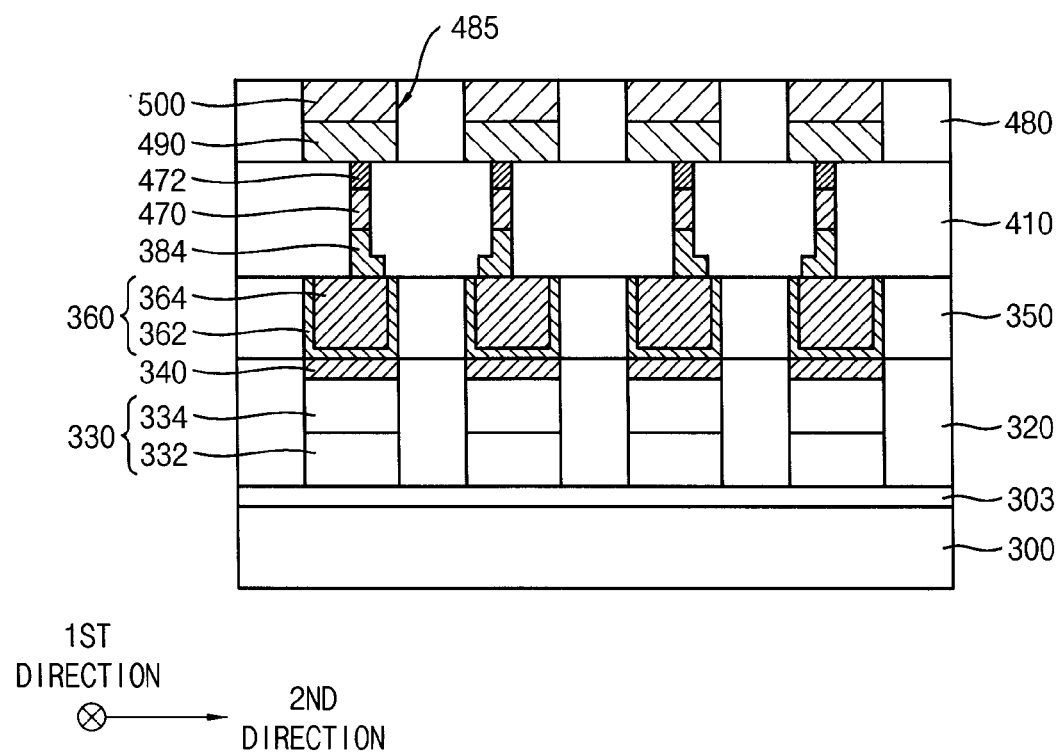
Figure 44:
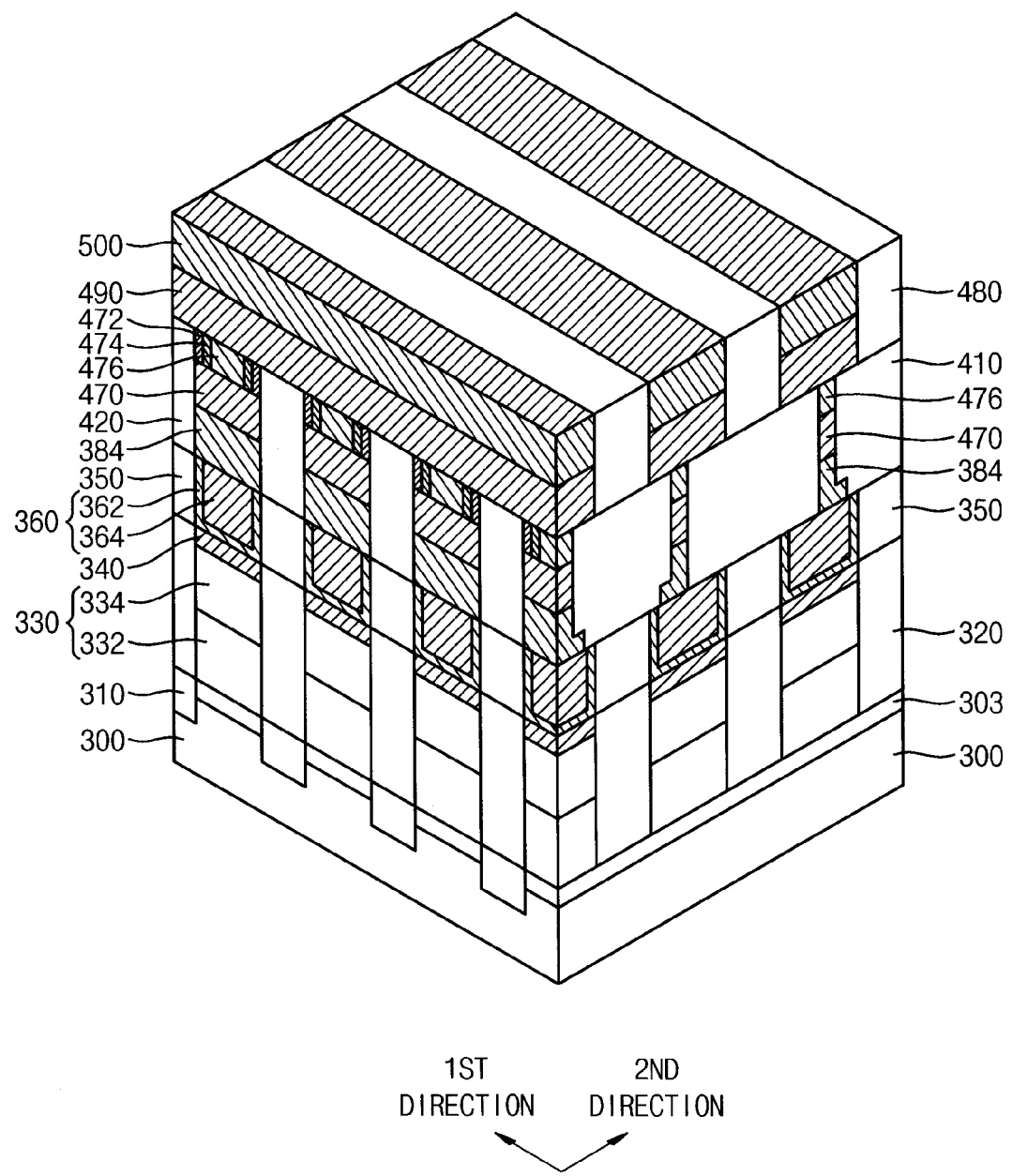

FIGS. 34 to 43 illustrate another embodiment of a method of manufacturing a phase change memory device in accordance according to the inventive concept, and FIG. 44 is a perspective view of an example of a phase change memory device made by such a method. More particularly, FIGS. 34, 36, 38, 40 and 42 are cross-sectional views of the device during the course of its manufacture as taken along a first direction substantially parallel to a top surface of a substrate, and FIGS. 35, 37, 39, 41 and 43 are cross-sectional views taken along a second direction substantially parallel to the top surface of the substrate and substantially perpendicular to the first direction. The method of manufacturing the phase change memory device may include processes similar to those illustrated in and described with reference to FIGS. 1 to 33. Thus, detailed descriptions of these similar processes may be omitted hereinafter for the sake of brevity.

First, processes similar to those illustrated with reference to FIGS. 1 to 22 may be performed. Thus, an isolation layer pattern 310, word lines 303, diodes 330, ohmic patterns 340, contact plugs 360, first to fifth insulating interlayers 320, 350, 370, 410 and 420, lower electrodes 384, and a first phase change material layer 471 may be formed.

In an example of this embodiment, the first phase change material layer 471 is formed to include a large amount of carbon in consideration of interface characteristics between the lower electrodes 384 and a subsequently formed fourth phase change material layer 473 (refer to the description of FIGS. 34 and 35 below).

Figure 34:
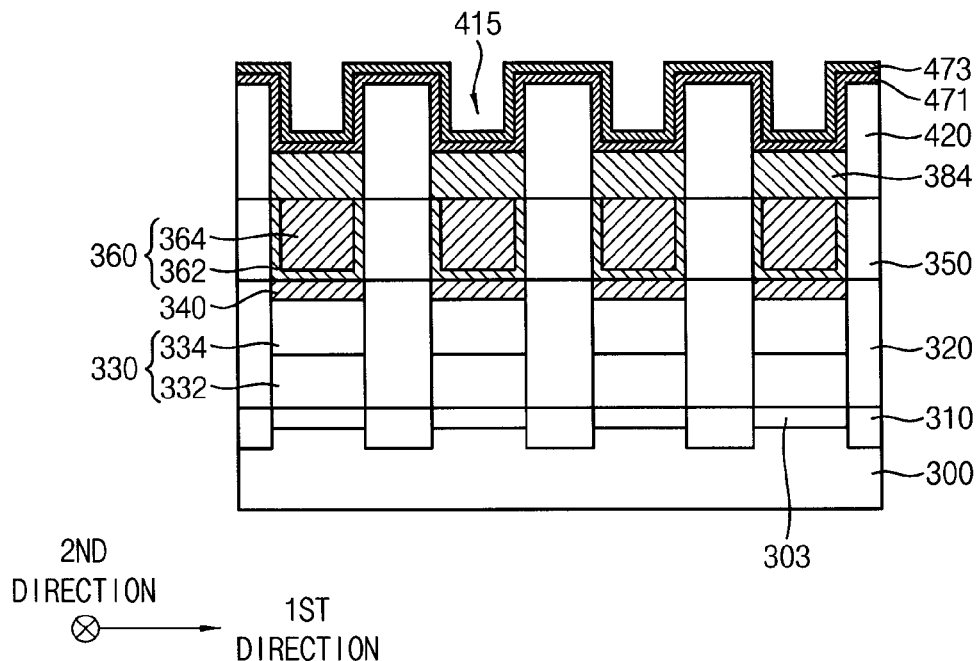
Figure 35:
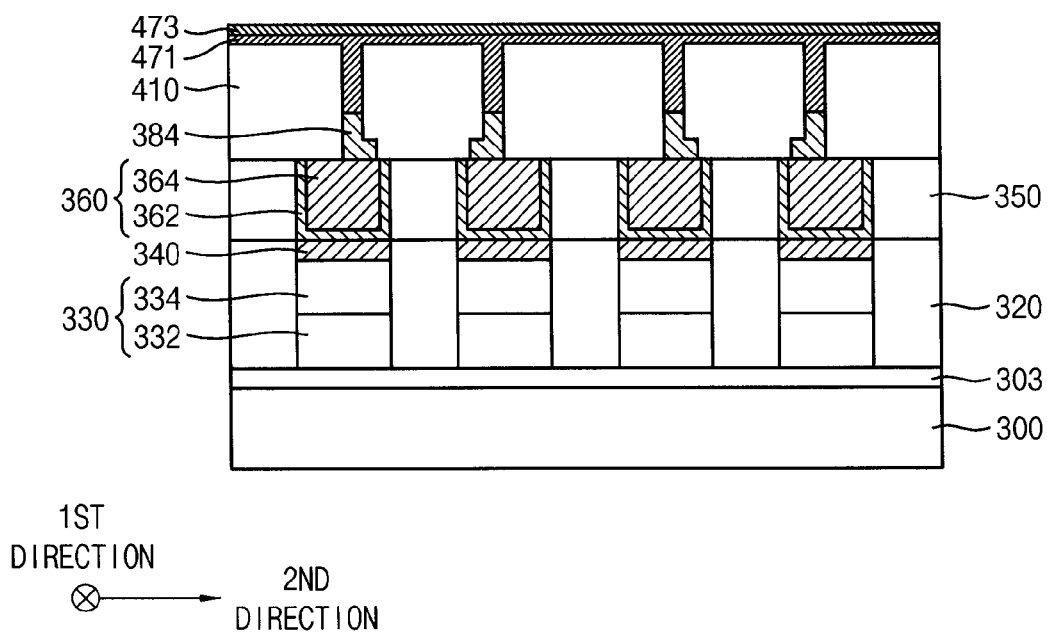

Referring to FIGS. 34 and 35, a second phase change material layer 473 partially filling the recesses 415 is formed on the first phase change material layer 471. In an example of this embodiment according to the inventive concept, the second phase change material layer 473 includes germanium at a concentration less than that of the first phase change material layer 471 and is formed to a thickness greater than the thickness of the first phase change material layer 471. Also, the second phase change material layer 473 may be formed to include a relatively large amount of antimony in consideration of enhancing the operation speed of the phase change memory device.

The second phase change material layer 473 may be formed to include a chalcogen compound, e.g., GeSbTe (GST), and at least one element selected from the group consisting of carbon, boron, nitrogen, oxygen, silicon, indium, bismuth, phosphorus, sulfur, aluminum, gallium, arsenic, selenium, zirconium, cadmium, tin, and polonium. The second phase change material layer 473 may be formed by providing a second deposition source having a composition different from that of the first deposition source onto the substrate 300. The second deposition source may be provided onto the substrate 300 at a temperature at which the second deposition source may be volatilized. The temperature varies depending on the composition of the second deposition source.

The second deposition source may be provided onto the substrate 300 by a PVD process. Thus, the second phase change material layer 473 may have excellent step coverage, and may be conformally formed on the structure including the recesses 415 to a uniform thickness, i.e., without having portions overhanging the recesses 415.

In other examples of this embodiment, one or more additional phase change material layers (not shown) are formed on the second phase change material layer 473, and each having a composition different from the other and the second phase change material layer 473 and partially filling the recesses 415. The additional phase change material layer(s) may be formed in consideration of the desired electrical characteristics to be imparted to the phase change memory device.

Figure 36:
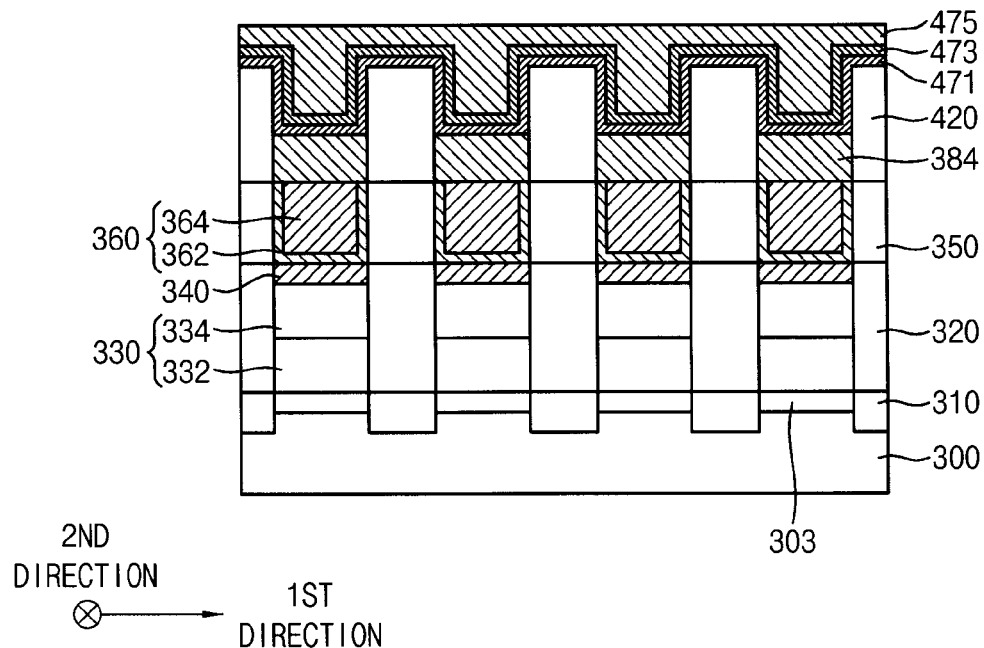
Figure 37:
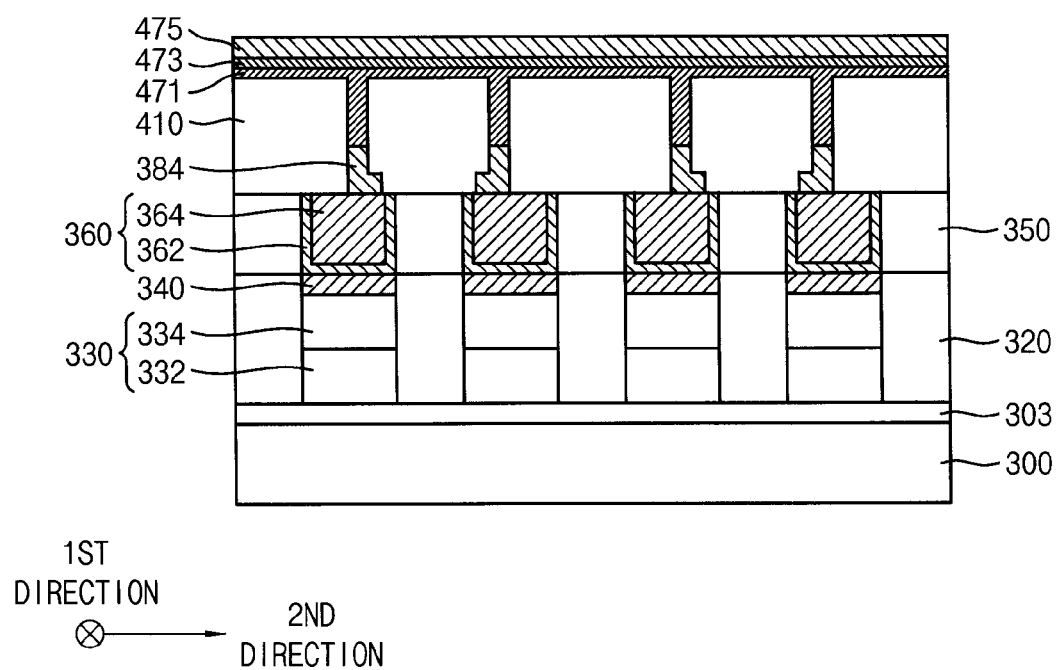

Referring to FIGS. 36 and 37, a process similar to that illustrated in and described with reference to FIGS. 23 and 24 may be performed to form a third phase change material layer 475 on the fourth phase change material layer 473. The third phase change material layer 475 is formed to a thickness sufficient to fill what remains of the recesses 415. Thus, the third phase change material layer 475 in this embodiment may be a blanket layer. Also, the third phase change material layer 475 has a composition different from each of those of the previously formed conformal phase change material layers.

For example, the third phase change material layer 475 may be formed to include germanium at a concentration less than each of those of the first and second phase change material layers 471 and 473 and so as to be thicker than each of the first and second phase change material layers 471 and 473. The third phase change material layer 475 may be composed to have excellent gap-fill characteristics so that voids are not formed therein.

Figure 38:
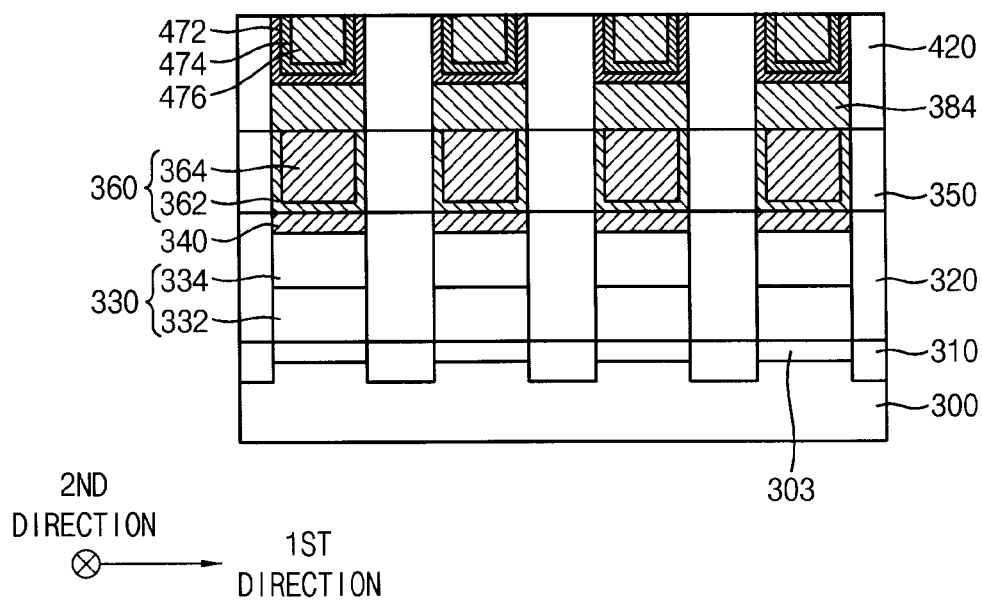
Figure 39:
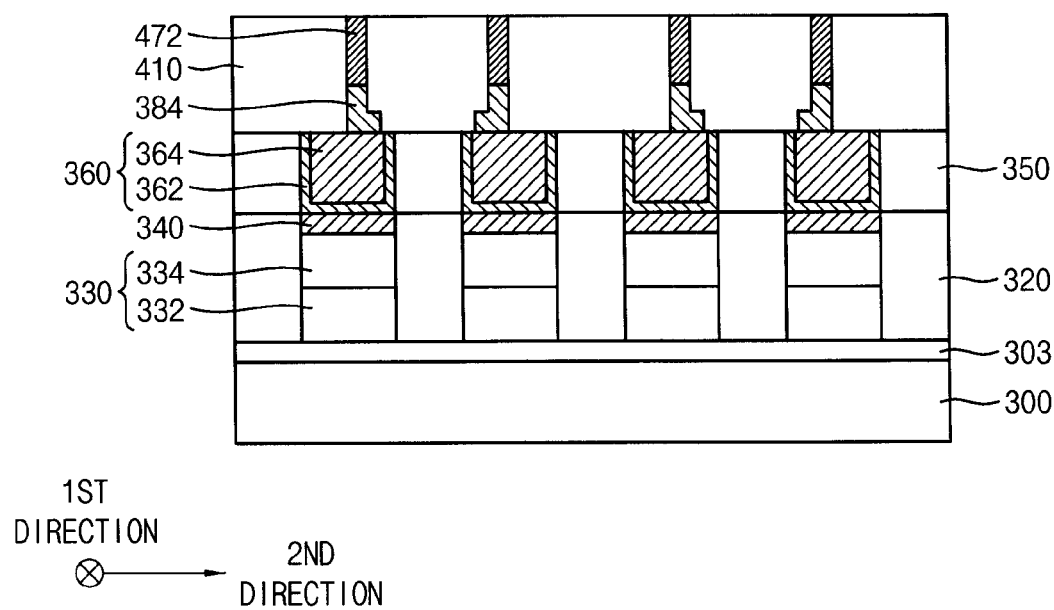

Referring to FIGS. 38 and 39, a process similar to that illustrated in and described with reference to FIGS. 25 and 26 may be performed. That is, the first, second and third phase change material layers 471, 473 and 475 may be planarized until top surfaces of the fourth and fifth insulating interlayers 410 and 420 are exposed to form first, second and third phase change material layer patterns 472, 474 and 476, respectively, in each of the recesses 415.

In embodiments according to the inventive concept, a plurality of first phase change material layer patterns 472, a plurality of second phase change material layer patterns 474, and a plurality of third phase change material layer patterns 476 may be formed in both the first and second directions to provide a first phase change material layer pattern array, a second phase change material layer pattern array, and a third phase change material layer pattern array, respectively.

The third phase change material layer 475 may be formed to have a thickness greater than that of the first and second phase change material layers 471 and 473 but have a germanium concentration less than those of the first and second phase change material layers 471 and 473. Thus the first, second and third phase change material layers 471, 473 and 475 may be easily planarized. Accordingly, no residue of the first, second and third phase change material layers 471, 473 and 475 may be left on the fourth and fifth insulating interlayers 410 and 420, so that electrical shorts are prevented.

Figure 40:
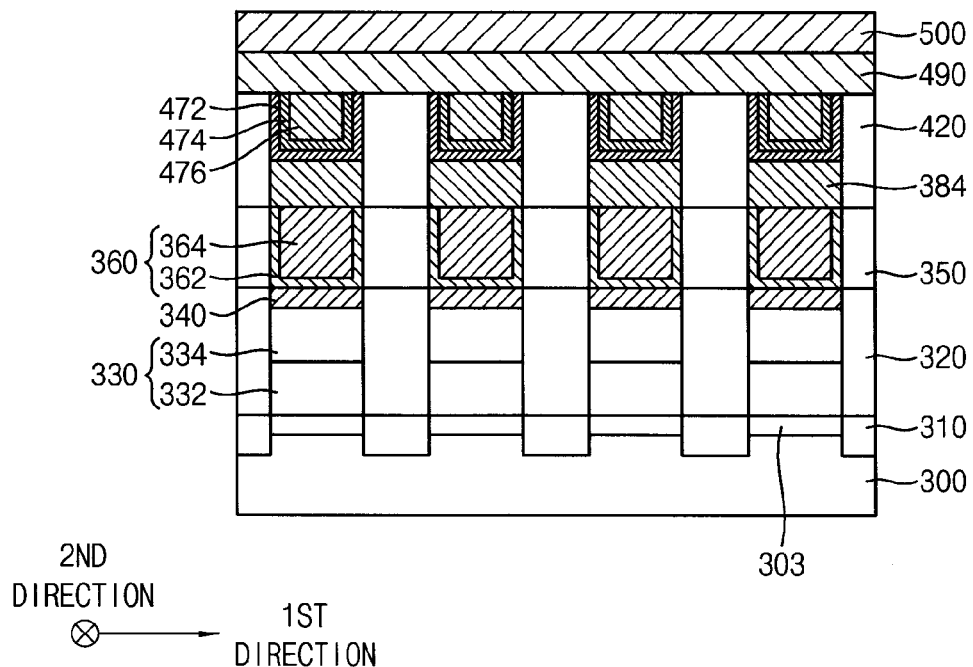
Figure 41:
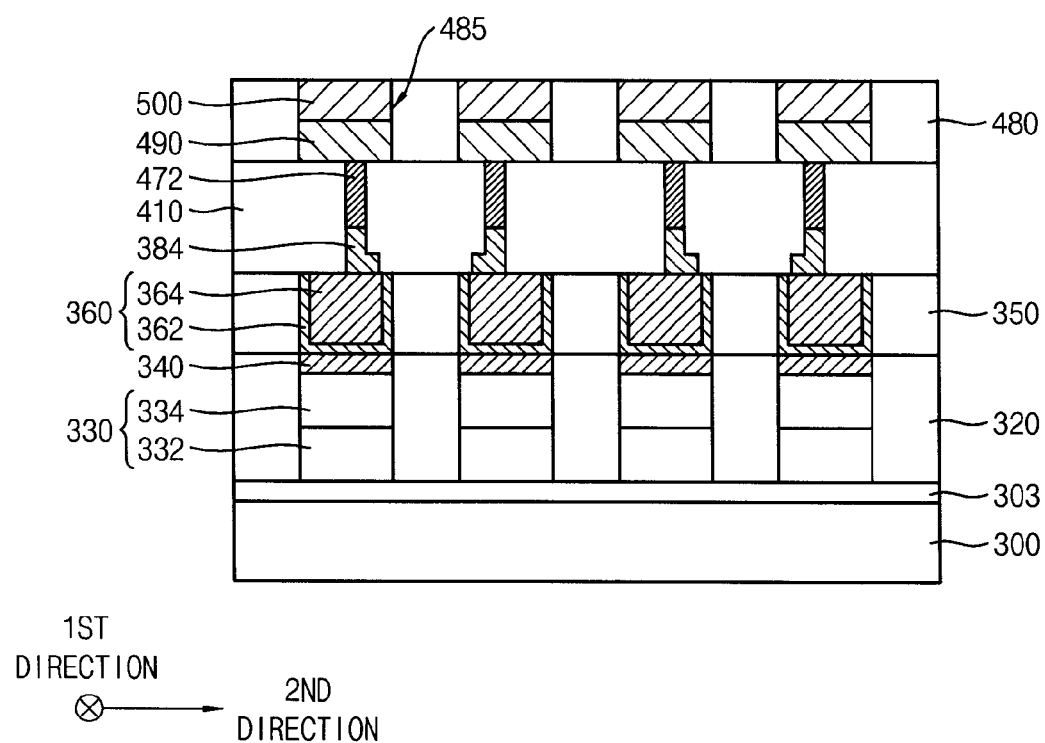

Referring to FIGS. 40 and 41, a process similar to that illustrated in and described with reference to FIGS. 27 and 28 may be performed. Thus, a sixth insulating interlayer 480 having third openings 485 therethrough may be formed on the fourth and fifth insulating interlayers 410 and 420, and an upper electrode 490 and a bit line 500 may be sequentially formed on the first, second and third phase change material layer patterns 472, 474 and 476 as electrically connected thereto.

The third openings 485 may expose top surfaces of the first, fourth and second phase change material layer patterns 472, 474 and 476. The third openings 485 may be formed as spaced from each other in the second direction, and each of the third openings 485 may extend in the first direction. Thus, each upper electrode 490 may also extend in the first direction, and a plurality of upper electrodes 490 may be formed as spaced from each other in the second direction to provide an upper electrode array. Additionally, each bit line 500 may extend in the first direction, and a plurality of bit lines 500 may be formed as spaced from each other in the second direction. The upper electrode 490 may directly contact top surfaces of the first, second and third phase change material layer patterns 472, 474 and 476.

Referring to FIGS. 42 to 44, a process similar to that illustrated in and described with reference to FIGS. 29, 30 and 33 may be performed to form a fourth phase change material layer pattern 470 (i.e., a mixed phase change material layer pattern) including elements (at least one each) from the first, second and third phase change material layer patterns 472, 474 and 476.

Figure 31:
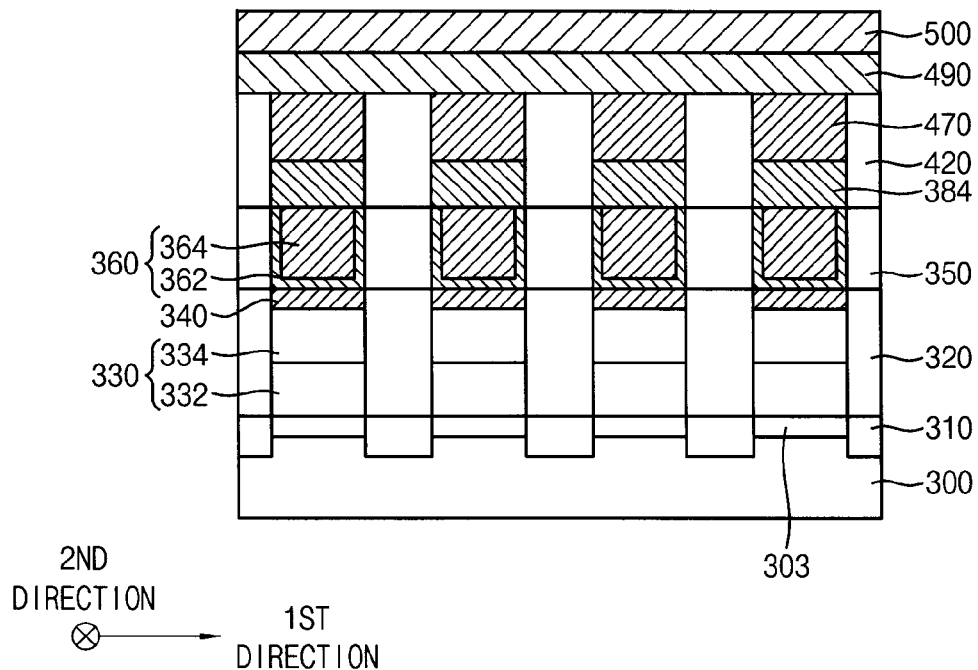

In embodiments according to the inventive concept, the fourth phase change material layer pattern 470 may be formed by applying energy, e.g., by supplying current, to the first, second and third phase change material layer patterns 472, 474 and 476. The first, second and third phase change material layer patterns 472, 474 and 476 may be crystallized by the current in a process in which the elements thereof become mixed. Thus, the fourth phase change material layer pattern 470 may fill part of each of the recesses 415 as shown, and a plurality of fourth phase change material layer patterns 470 may be formed in both the first and second directions. However, depending on the desired electrical characteristics of the phase change memory device, the fourth phase change material layer pattern 470 may be formed to fill the recesses 415 similar to what is shown in FIGS. 31 and 32. That is, the first, fourth and second phase change material layer patterns 472, 474 and 476 may be completely mixed and crystallized by the current so that the fourth phase change material layer pattern 470 fills the recesses 415.

In any case, the fourth phase change material layer pattern 470 is formed to have a composition different from each of those of the first, second and third phase change material layer patterns 472, 474 and 476. In an example of this embodiment, the fourth phase change material layer pattern 470 may be formed to have a germanium concentration of about 0.01 weight percent to about 8 weight percent in which case the phase change memory device may have an enhanced operation speed. Alternatively, the fourth phase change material layer pattern 470 may be formed to have a germanium concentration of about 15 weight percent to about 99 weight percent. Thus, in this case, the phase change memory device may have enhanced refresh characteristics.

As described above, a plurality of phase change material layer patterns comprising chalcogen compounds having different compositions (e.g., ratios of elements), respectively, may be sequentially formed, and current may be supplied thereto, so that a phase change material layer pattern having a desired composition may be formed. Thus, a phase change memory device having a high operation speed or enhanced refresh characteristics may be manufactured.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a phase change memory device, the method comprising:
   forming an insulating interlayer on a substrate, the insulating interlayer having an opening therethrough;
   forming a first phase change material layer pattern along a surface defining sides of the opening;
   forming a second phase change material layer pattern on the first phase change material layer pattern in a portion of the opening, the second phase change material layer pattern having a composition different from that of the first phase change material layer pattern; and
   applying energy to the first and second phase change material layer patterns to form a third phase change material layer pattern having a composition different from that of each of the first and second phase change material layer patterns and including elements from both of the first and second phase change material layer patterns.

2. The method of claim 1, wherein the applying of the energy to the first and second phase change material layer patterns comprises supplying current to the first and second phase change material layer patterns.

3. The method claim 1, wherein the first and second phase change material layer patterns include germanium, and wherein the germanium concentration of the second phase change material layer pattern is less than that of the first phase change material layer pattern.

4. The method of claim 3, wherein the first and second phase change material layer patterns further comprise at least one element selected from the group consisting of carbon, boron, nitrogen, oxygen, silicon, indium, bismuth, phosphorus, sulfur, aluminum, gallium, arsenic, selenium, zirconium, cadmium, tin, and polonium.

5. The method of claim 3, wherein the third phase change material layer pattern has a germanium concentration of 0.01 weight percent to 8 weight percent.

6. The method of claim 1, wherein the third phase change material layer pattern has a germanium concentration of 15 weight percent to 99 weight percent.

7. The method of claim 1, wherein the first phase change material layer pattern is formed by a PVD process, and the second phase change material layer pattern is formed by a CVD process or an ALD process.

8. The method of claim 1, wherein the first phase change material layer pattern is formed at a first temperature, and the second phase change material layer pattern is formed at a second temperature higher than the first temperature.

9. The method of claim 1, wherein the forming of the first phase change material layer pattern and the second phase change material layer pattern comprise:
   conformally forming a first phase change material layer along the surface defining the sides of the opening and along the top of the insulating interlayer, whereby a portion of the opening remains unfilled;
   forming a second phase change material layer on the first phase change material layer to fill a remaining portion of the opening; and
   planarizing the first and second phase change material layers until a top surface of the insulating interlayer is exposed.

10. The method of claim 1, further comprising forming a lower electrode on the substrate before the insulating interlayer is formed, and wherein the lower electrode is partially exposed by the opening.

11. The method of claim 1, further comprising forming an upper electrode electrically connected to the first and second phase change material layer patterns, before the third phase change material layer pattern is formed.

12. A method of manufacturing a phase change memory device, the method comprising:
   forming an insulating interlayer on a substrate, the insulating interlayer having an opening therethrough;
   forming a plurality of phase change material layers each on a surface defining sides of the opening and atop the insulating interlayer, the plurality of phase change material layers having different compositions from each other;
   planarizing the phase change material layers until a top surface of the insulating interlayer is exposed to form a plurality of preliminary phase change material layer patterns in the opening; and
   applying energy to the plurality of preliminary phase change material layer patterns to form a phase change material layer pattern having a composition different from each of those of the preliminary phase change material layer patterns, the phase change material layer pattern including elements from the plurality of preliminary phase change material layer patterns.

13. The method of claim 12, wherein the applying of the energy to the plurality of preliminary phase change material layer patterns comprises supplying current thereto.

14. The method of claim 12, wherein each of the plurality of phase change material layers comprises germanium and at least one element selected from the group consisting of carbon, boron, nitrogen, oxygen, silicon, indium, bismuth, phosphorus, sulfur, aluminum, gallium, arsenic, selenium, zirconium, cadmium, tin, and polonium.

15. The method of claim 12, wherein a lowermost one of the plurality of phase change material layers is formed by a PVD process, and each other of the plurality of phase change material layers are formed by a CVD process or an ALD process.

16. A method of manufacturing a phase change memory device, the method comprising:
   forming an insulating interlayer, having openings passing therethrough, on a substrate, wherein the openings are spaced apart from each other in at least one direction parallel to an upper surface of the substrate;
   forming at least one conformal layer comprising phase change material on the insulating interlayer such that each said at least one conformal layer extends within the openings and the at least one conformal layer leaves a portion of each of the openings unfilled;
   forming a blanket layer comprising phase change material directly on the at least one conformal layer to fill what remains of the openings, the phase change material of the blanket layer having a composition different from that of the first phase change material of each said at least one conformal layer;
   planarizing the at least one conformal layer and the blanket layer until a top surface of the interlayer insulating layer is exposed, thereby forming a plurality of patterns of phase change material in each of the openings; and
   applying energy to the phase change material layer patterns to form, within each of the openings, a pattern of phase change material having a composition different from that of the phase change material of each of the layers of phase change material and including a mixture of elements of phase change material from the at least one conformal and blanket layers.

17. The method of claim 16, wherein the applying of the energy to the phase change material layer patterns comprises connecting the phase change patterns to a source of current.

18. The method claim 16, wherein the phase change materials of each of the conformal and blanket layers are compounds, respectively, of the same elements but the ratio of the elements constituting each of the compounds differs from the ratio of the elements of each other compound.

19. The method claim 16, wherein the conformal and blanket layers each comprise germanium, and wherein the germanium concentration of the blanket layer is less than that of each said at least one conformal layer.

20. The method claim 19, wherein the phase change material of each of the conformal and blanket layers is a chalcogen, and the chalcogens of the conformal and blanket layers are compounds of the same elements but the ratio of the elements constituting each of the chalcogens differs from that of each other chalcogen.

* * * * *